(12) United States Patent
Yamaguchi et al.

(10) Patent No.: US 11,581,278 B2
(45) Date of Patent: Feb. 14, 2023

(54) SEMICONDUCTOR DEVICE AND METHOD OF FORMING THE SAME

(71) Applicant: MICRON TECHNOLOGY, INC., Boise, ID (US)

(72) Inventors: Hidenori Yamaguchi, Higashihiroshima (JP); Shunsuke Asanao, Higashihiroshima (JP); Katsumi Koge, Higashihiroshima (JP); Shigeharu Nishimura, Higashihiroshima (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/074,267

(22) Filed: Oct. 19, 2020

(65) Prior Publication Data
US 2022/0122931 A1 Apr. 21, 2022

(51) Int. Cl.
*H01L 23/00* (2006.01)
*H01L 23/522* (2006.01)
*H01L 23/532* (2006.01)
*H01L 21/768* (2006.01)

(52) U.S. Cl.
CPC ........ *H01L 24/05* (2013.01); *H01L 21/76877* (2013.01); *H01L 23/5226* (2013.01); *H01L 23/53257* (2013.01); *H01L 24/03* (2013.01); *H01L 2224/05684* (2013.01); *H01L 2924/37001* (2013.01)

(58) Field of Classification Search
CPC ............... H01L 24/05; H01L 21/76877; H01L 23/5226; H01L 23/53257; H01L 24/03; H01L 2224/05684; H01L 2924/37001
See application file for complete search history.

(56) References Cited

U.S. PATENT DOCUMENTS

| | | | |
|---|---|---|---|
| 6,525,382 B1 | 2/2003 | Ishida | |
| 10,770,653 B1* | 9/2020 | Penny | .................... G11C 11/161 |
| 2004/0140569 A1 | 7/2004 | Meguro et al. | |
| 2007/0080416 A1 | 4/2007 | Yoshioka et al. | |
| 2018/0159023 A1* | 6/2018 | Suh | ........................ H01L 27/222 |
| 2020/0092993 A1* | 3/2020 | Taneda | ................. H05K 3/4682 |

FOREIGN PATENT DOCUMENTS

| | | |
|---|---|---|
| KR | 20080101613 A | 11/2008 |
| KR | 20110056005 A | 5/2011 |

OTHER PUBLICATIONS

International Search Report and Written Opinion dated Feb. 7, 2022 for PCT Application No. PCT/US2021/055308.
PCT Application No. PCT/US21/55308 titled "Semiconductor Device And Method Of Forming The Same" filed Oct. 15, 2021.

* cited by examiner

*Primary Examiner* — Thanh T Nguyen
(74) *Attorney, Agent, or Firm* — Dorsey & Whitney LLP

(57) ABSTRACT

A semiconductor device includes a first layer including a plurality of wirings arranged in line and space layout and a second layer including a pad electrically connected to at least one of the wirings, wherein the wirings and the pads are patterned by different lithographic processes.

11 Claims, 27 Drawing Sheets

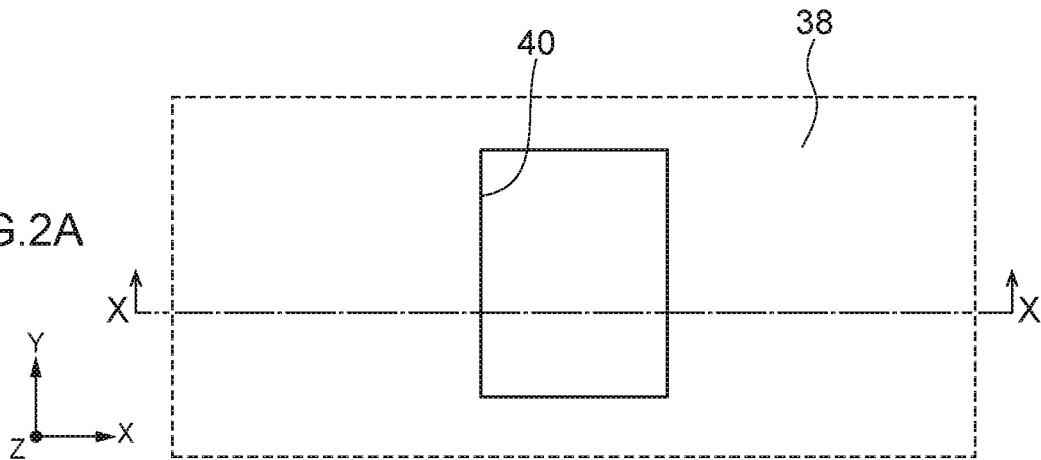
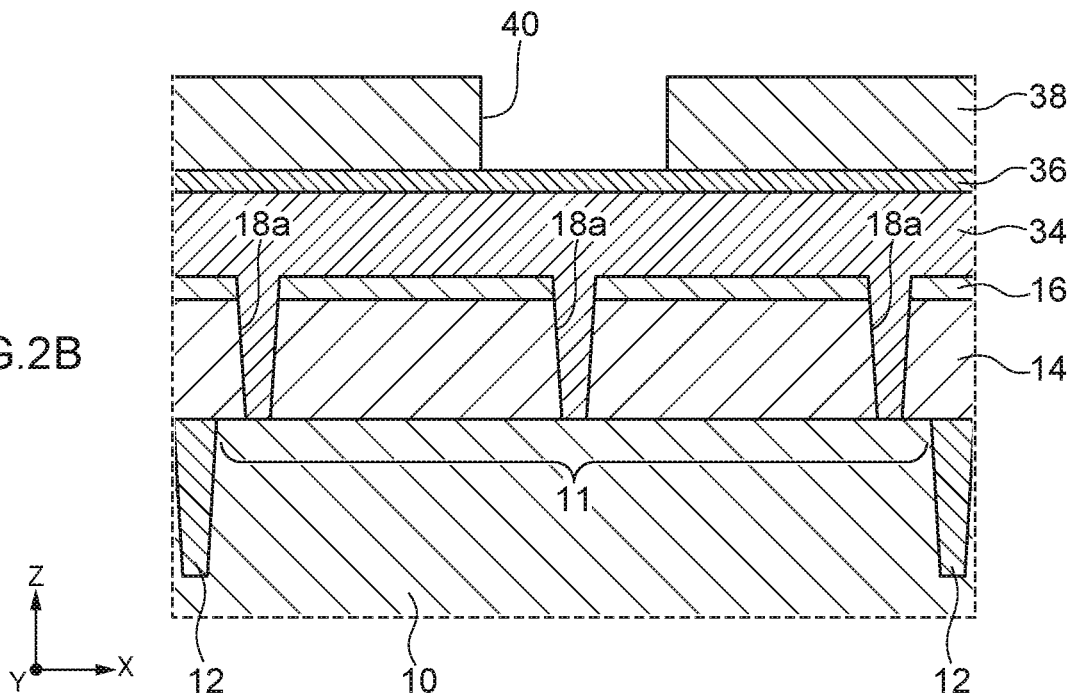

SEMICONDUCTOR DEVICE AND METHOD OF FORMING THE SAME

BACKGROUND

Reductions in the chip area of DRAM have been achieved with finer circuit pattern sizes and reductions in the pattern pitch. With regard to a memory cell portion having a highly repetitive pattern, a desired fine pattern can be formed relatively easily by improving the resolution with high-NA photolithography exposure, or by using a method called double patterning that halves the pitch of the original photoresist pattern.

On the other hand, peripheral circuits other than the memory cell portion, such as an amplifier circuit and a driver circuit that are essential for memory cell operation for example, the pattern line widths are non-uniform compared to the memory cell pattern, and are configured in what is called a two-dimensional pattern. Consequently, compared to a highly repetitive memory cell pattern, the high-NA exposure conditions and intense exposure illumination conditions with high resolution (strong interference effect) cannot be used, and as a result, technical challenges such as a difficulty in improving fineness have occurred. For this reason, it is difficult to achieve a layout that fills in the gaps of the pattern pitch or between one pattern and another pattern.

BRIEF DESCRIPTION OF THE DRAWINGS

FIGS. 1A and 1B are a plan view and a longitudinal section illustrating one example of the schematic configuration in an exemplary process stage following FIGS. 12A and 12B. FIG. 1B is a longitudinal section illustrating one example of the schematic configuration of a portion along the line X-X in FIG. 1A.

FIGS. 2A to 12A and 2B to 12B are diagrams illustrating the semiconductor device according to the first embodiment and a method of forming the same, and sequentially illustrate the schematic configuration in exemplary process stages. FIGS. 2A to 12A are plan views, while FIGS. 2B to 12B are longitudinal sections illustrating an example of the schematic configuration of the portion along the line X-X in FIGS. 2A to 12A.

FIGS. 13A and 13B are a plan view and a longitudinal section illustrating one example of the schematic configuration in an exemplary process stage following FIGS. 19A and 19B. FIG. 13B is a longitudinal section illustrating one example of the schematic configuration of a portion along the line Y-Y in FIG. 13A.

FIGS. 14A to 19A and 14B to 19B are diagrams illustrating the semiconductor device according to the second embodiment and a method of forming the same, and sequentially illustrate the schematic configuration in exemplary process stages. FIGS. 14A to 19A are plan views, while FIGS. 14B to 19B are longitudinal sections illustrating an example of the schematic configuration of the portion along the line Y-Y in FIGS. 14A to 19A.

FIGS. 20A and 20B are a plan view and a longitudinal section illustrating one example of the schematic configuration in an exemplary process stage following FIGS. 27A and 27B. FIG. 20B is a longitudinal section illustrating one example of the schematic configuration of a portion along the line Z-Z in FIG. 20A.

FIGS. 21A to 27A and 21B to 27B are diagrams illustrating the semiconductor device according to the third embodiment and a method of forming the same, and sequentially illustrate the schematic configuration in exemplary process stages. FIGS. 21A to 27A are plan views, while FIGS. 21B to 27B are longitudinal sections illustrating an example of the schematic configuration of the portion along the line Z-Z in FIGS. 21A to 27A.

DETAILED DESCRIPTION

Various embodiments of the present invention will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structure, logical and electrical changes may be made without departing from the scope of the present invention. The various embodiments disclosed herein are not necessary mutually exclusive, as some disclosed embodiments can be combined with one or more other disclosed embodiments to form new embodiments.

First Embodiment

A semiconductor device 1A according to the first embodiment will be described with reference to FIGS. 1A and 1B. In the following description, DRAM is given as an example of the semiconductor device 1. In the following description, the Y direction illustrated in the diagrams may also be referred to as the top or upward direction in some cases.

Figure 1A:
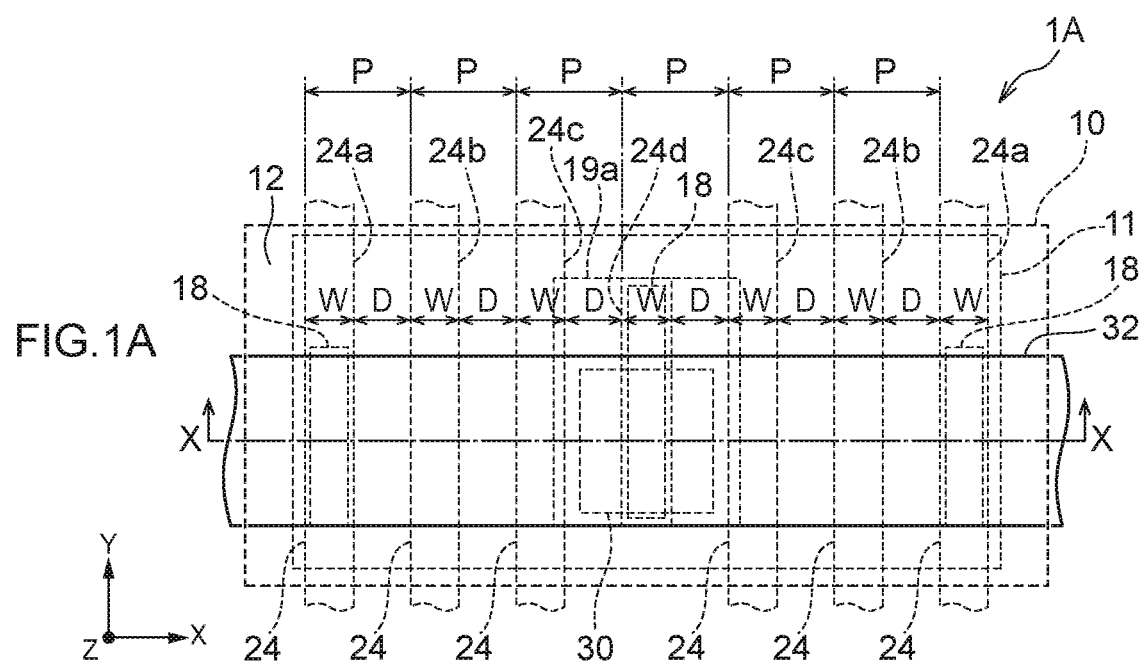
FIG. 1A is a plan view illustrating one example of a schematic configuration of the layout of a semiconductor wafer surface according to a first embodiment.

FIG. 1A is a plan view illustrating a schematic configuration of the semiconductor device 1A. FIG. 1A illustrates a portion of a peripheral circuit region of a DRAM memory cell, for example. The semiconductor device 1A is provided with a main surface of a semiconductor wafer on which various elements, insulating films, conductive films, and the like are formed. The semiconductor device 1A illustrated in FIG. 1A is schematically illustrated in the state before the semiconductor wafer is cut by a dicing step, or in other words, the configuration of a portion of the semiconductor device 1A is schematically illustrated in the state before the semiconductor device 1A is separated into individual semiconductor chips.

As illustrated in FIG. 1A, the semiconductor device 1A is provided with a first wiring layer 24 on a semiconductor substrate 10. The first wiring layer 24 includes first wirings 24a, second wirings 24b, third wirings 24c, and a fourth wiring 24d arranged in a line and space layout. The first wirings 24a, second wirings 24b, third wirings 24c, and fourth wiring 24d are arranged in parallel at equal distances from each other in the X direction. The first wirings 24a, the second wirings 24b, and the third wirings 24c have a predetermined width W in the X direction. The first wirings 24a, the second wirings 24b, and the third wirings 24c extend in the Y direction. The fourth wiring 24d has a predetermined width W in the X direction, and extends in the Y direction with a predetermined length. The first wirings 24a, second wirings 24b, third wirings 24c, and fourth wiring 24d have a predetermined distance D between each other. A repeating pitch P of the first wirings 24a, second wirings 24b, third wirings 24c, and fourth wiring 24d is the sum (W+D) of the width W and the distance D.

As illustrated in FIG. 1A, the first wirings 24a, second wirings 24b, third wirings 24c, and fourth wiring 24d are arranged symmetrically in order on either side in the X direction, centered on the fourth wiring 24d. The first wirings 24a, second wirings 24b, third wirings 24c, and fourth wiring 24d are disposed to have the same width W, the same distance D, and the same pitch P.

Contact electrodes 18 are overlaid onto the first wirings 24a, and a pad 19a having a top face with a width in the X direction greater than a width of the fourth wiring 24d is overlaid onto the fourth wiring 24d. A contact electrode 18 of substantially the same shape as the fourth wiring 24d is overlaid onto the pad 19a. Also, the edge portions in the X direction of the pad 19a are partly overlaid onto the adjacent third wirings 24c with a third insulating film 20 sandwiched in between in the Y direction, or in other words the vertical direction. The pad 19a is electrically connected to the fourth wiring 24d, which is one of the wirings included in the first wiring layer 24. Furthermore, a wiring 32 that extends in the X direction is overlaid onto a through-hole electrode 30.

Figure 1B:
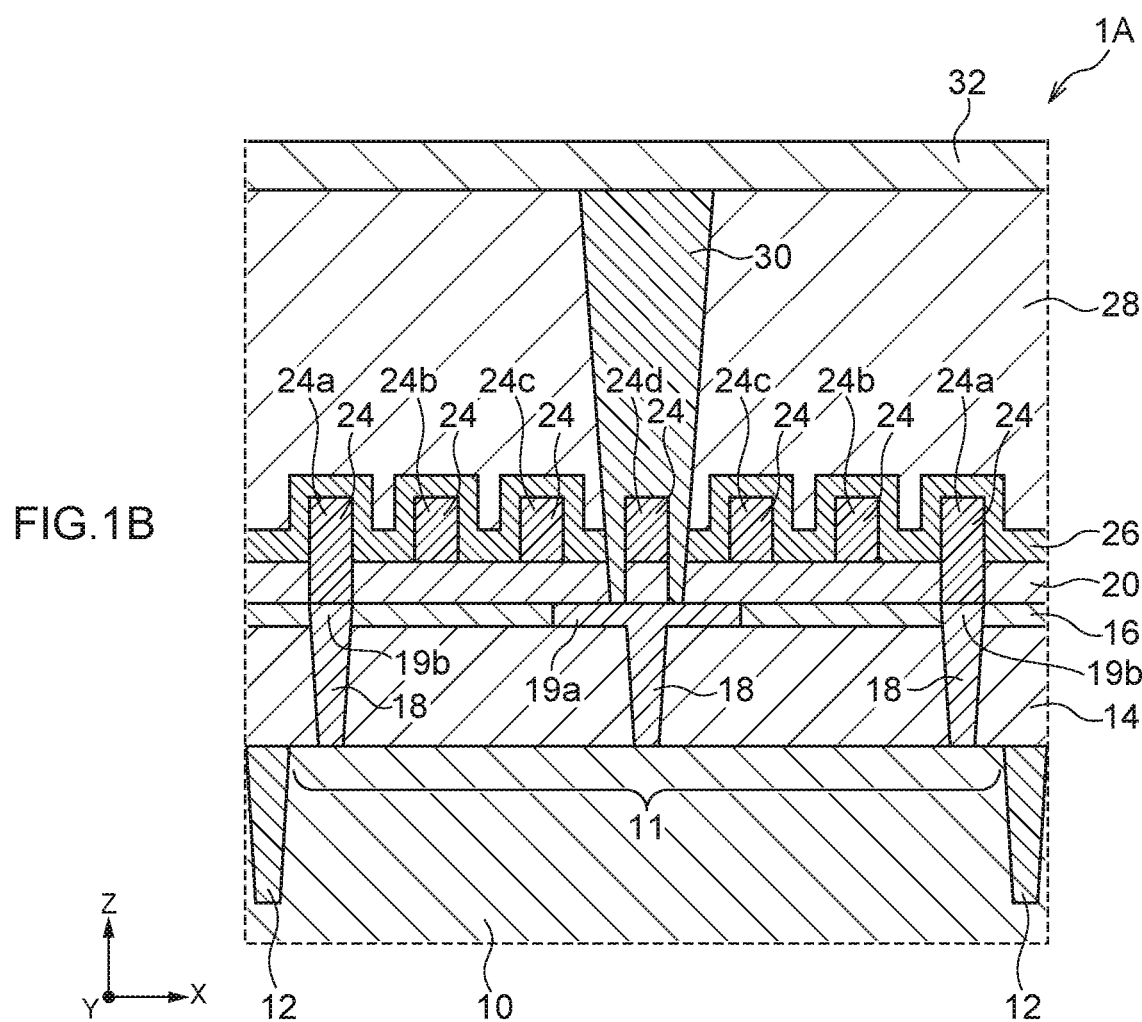
FIG. 1B is a diagram illustrating a semiconductor device according to the first embodiment and a method of forming the same, and illustrates one example of the schematic configuration in a final process stage.

FIG. 1B is a longitudinal section illustrating one example of the schematic configuration of a portion along the line X-X in FIG. 1A. The semiconductor device 1A is provided with the semiconductor substrate 10, an element isolation 12 provided on the semiconductor substrate 10, and an active portion 11 demarcated by the element isolation 12. The semiconductor substrate 10 contains a single-crystal semiconductor substrate such as a single-crystal silicon substrate, for example. The element isolation 12 includes a shallow trench isolation formed by embedding an insulating material such as silicon dioxide into a trench provided in the semiconductor substrate 10. The element isolation 12 electrically isolates elements from each other. The active portion 11 is provided with a diffusion layer doped with a dopant such as phosphorous, boron, or arsenic, for example.

A first insulating film 14 and a second insulating film 16 are provided on the semiconductor substrate 10, and the contact electrodes 18 and the pad 19a are formed in the stack of the first insulating film 14 and the second insulating film 16. The first insulating film 14 contains an insulating material such as silicon oxide. The second insulating film 16 contains an insulating material such as silicon nitride. The contact electrodes 18 contain a metal such as tungsten (W), for example. The pad 19a contains a metal such as tungsten (W), for example. The pad 19a is embedded into an opening formed in the second insulating film 16. The pad 19a is disposed in a layer that overlaps with the second insulating film 16. In this case, the contact electrode 18 and the pad 19a are formed as one, but may also be formed as separate layers.

The third insulating film 20 is provided on top of the second insulating film 16, and the first wiring layer 24 is provided on top of the third insulating film 20. The first wiring layer 24 includes the first wirings 24a, the second wirings 24b, the third wirings 24c, and the fourth wiring 24d. The first wirings 24a extend downward and are connected to the contact electrodes 18. The position of the top face of the pad 19a is set to be substantially the same as the position of the bottom faces of the first wirings 24a, the second wirings 24b, and the third wirings 24c, other than the fourth wiring 24d contacting the top face of the pad 19a. A fifth insulating film 26 and a sixth insulating film 28 are provided on top of the first wiring layer 24. The fifth insulating film 26 contains an insulating material such as silicon nitride. The sixth insulating film 28 contains an insulating material such as silicon oxide. Note that the fourth wiring 24d may have a structure similar to the first wirings 24a, in which the fourth wiring 24d extends downward and contacts the pad 19a. Pads 19b disposed in a layer that overlaps with the second insulating film 16 are disposed in an upper portion of the contact electrodes 18 connected to the first wirings 24a. The first wirings 24a and the pads 19b contact each other. The width of the pads 19b is less than the width of the pad 19a.

In the sixth insulating film 28, the through-hole electrode 30 contacting the top and side faces of the fourth wiring 24d as well as the top face of the pad 19a is provided from the top face of the sixth insulating film 28. The wiring 32 is provided so as to contact the top face of the sixth insulating film 28 and the top face of the through-hole electrode 30.

The third insulating film 20 is disposed between the first wiring layer 24 and the pad 19a. As illustrated in FIG. 1A, in a plan view, the pad 19a is disposed to surround the fourth wiring 24d. Even if the through-hole electrode 30 is slightly mispositioned but still exists in the range above the pad 19a, electrical continuity between the through-hole electrode 30 and the contact electrode 18 can be attained. The third wiring 24c and the pad 19a are insulated by the third insulating film 20. The pad 19a and the third wiring 24c are not electrically connected despite overlapping in the plan view layout. For this reason, a larger area of the pad 19a can be set, thereby making it possible to further avoid a situation in which the through-hole electrode 30 misses the pad 19a.

Next, a method of forming the semiconductor device 1A according to the first embodiment will be described with reference from FIGS. 1A and 1B to FIGS. 12A and 12B. First, as illustrated in FIGS. 2A and 2B, the element isolation 12 and the active portion 11 are formed in the semiconductor substrate 10, the first insulating film 14 and the second insulating film 16 are formed, and then contact holes 18a that reach the surface of the active portion 11 are formed in the first insulating film 14 and the second insulating film 16 by lithography. An insulating material such as silicon dioxide or silicon nitride for example is embedded in the element isolation 12, and these insulating films are deposited by chemical vapor deposition (hereinafter referred to as "CVD"), for example.

Thereafter, a seventh insulating film 34 is formed inside the contact holes 18a and on the second insulating film 16. Additionally, a mask insulating film 36 is formed on the seventh insulating film 34. A photoresist 38 having an opening 40 patterned therein by lithography is formed on the mask insulating film 36. The opening 40 formed in the photoresist 38 corresponds to the shape of the pad 19a to be formed later. The seventh insulating film 34 and the mask insulating film 36 contain an insulating material, for example. The seventh insulating film 34 contains spin-on carbon (SOC), for example. The mask insulating film 36 contains organic spin-on glass, and contains siloxane-type spin-coated glass (Si-HM).

Figure 3A:
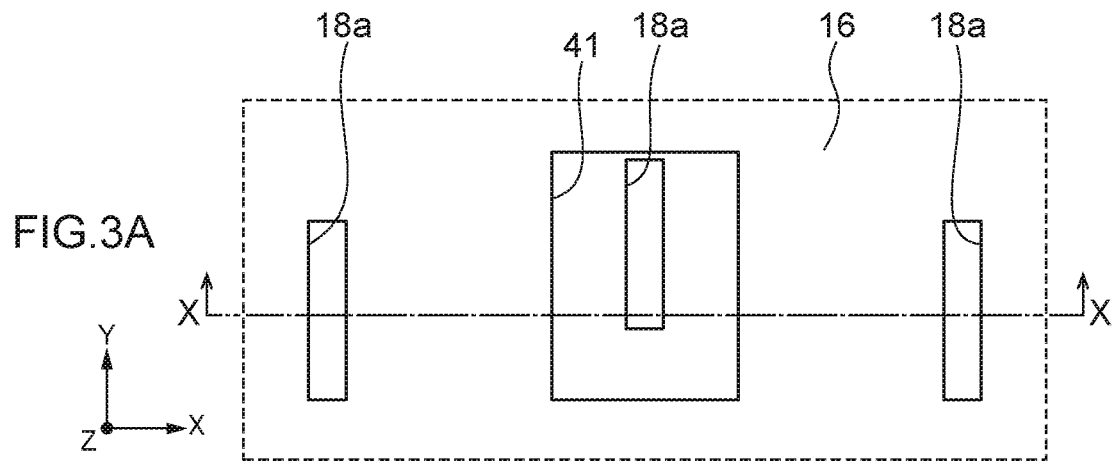
Figure 3B:
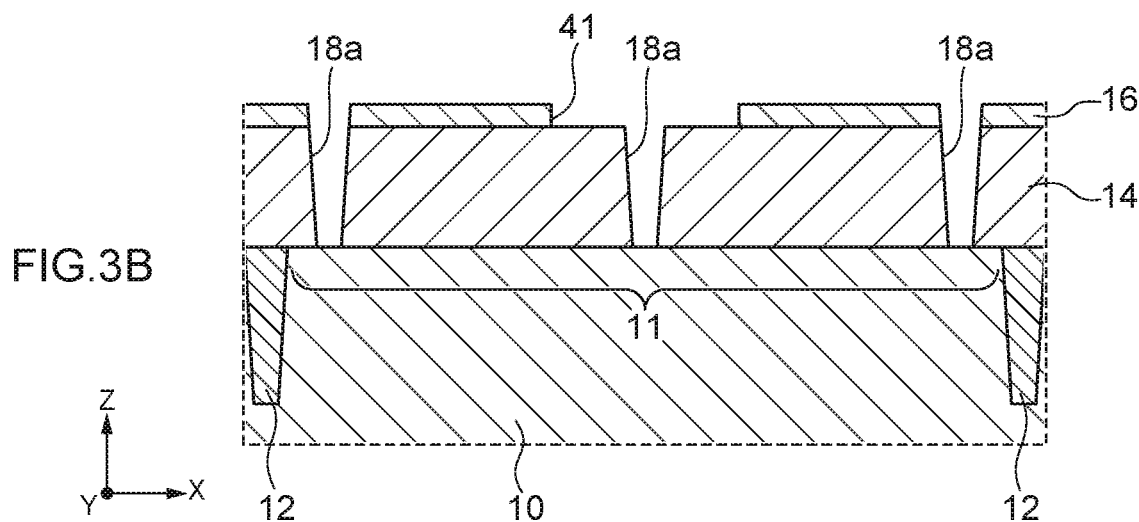

Next, as illustrated in FIGS. 3A and 3B, dry etching is performed using the photoresist 38 as an etching mask to pattern the mask insulating film 36. Additionally, the patterned mask insulating film 36 is used as an etching mask to pattern the second insulating film 16 and form an opening 41 to which the opening 40 is transferred. After that, the seventh insulating film 34 and the mask insulating film 36 are removed to expose the contact hole 18a and the first insulating film 14 in the opening 41, and the surface of the second insulating film 16.

Figure 4A:
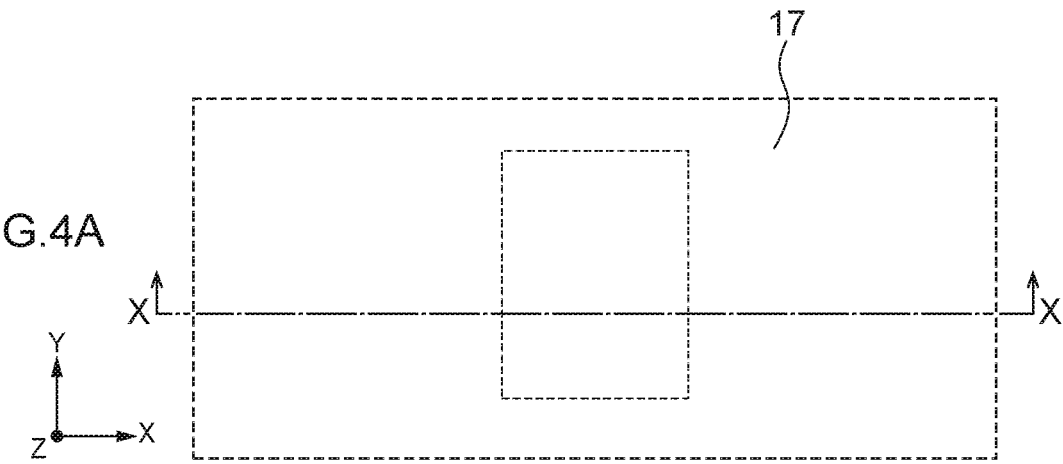
Figure 4B:
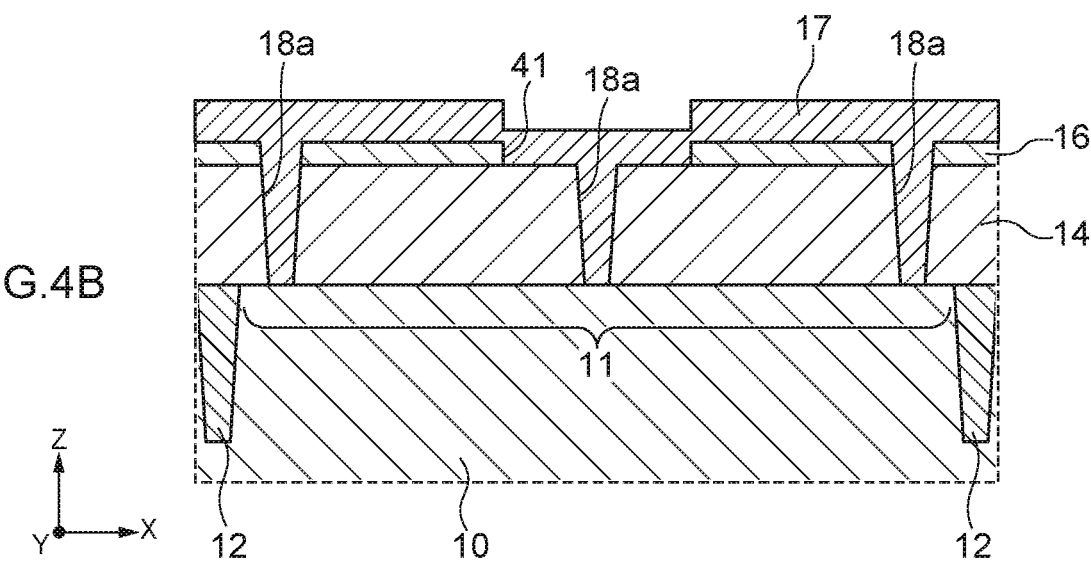

Next, as illustrated in FIGS. 4A and 4B, a first conductive film 17 is formed so as to be embedded in the contact holes 18a and the opening 41, and covering the top face of the second insulating film 16. The first conductive film 17 contains a conductive material such as metal, for example. The first conductive film 17 contains tungsten (W), for example. The first conductive film 17 is formed by CVD, for example.

Figure 5A:
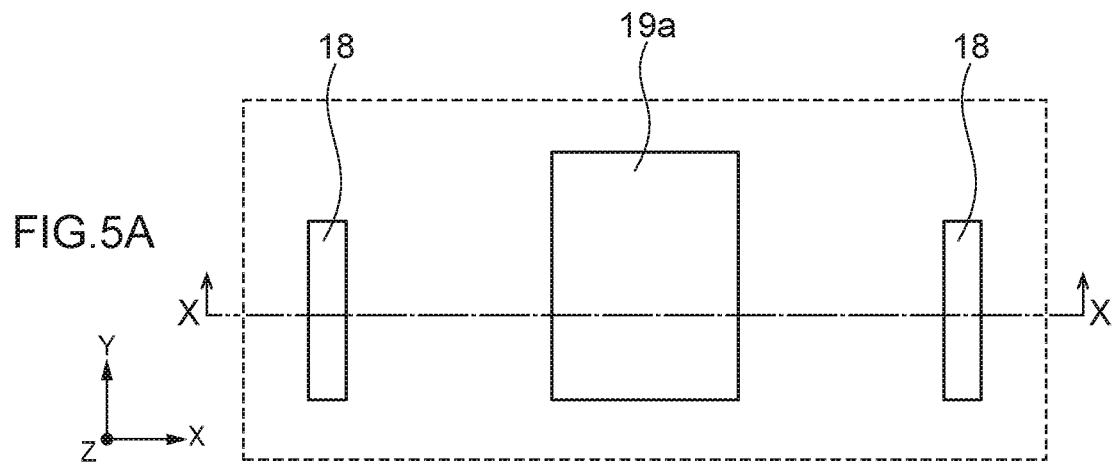
Figure 5B:
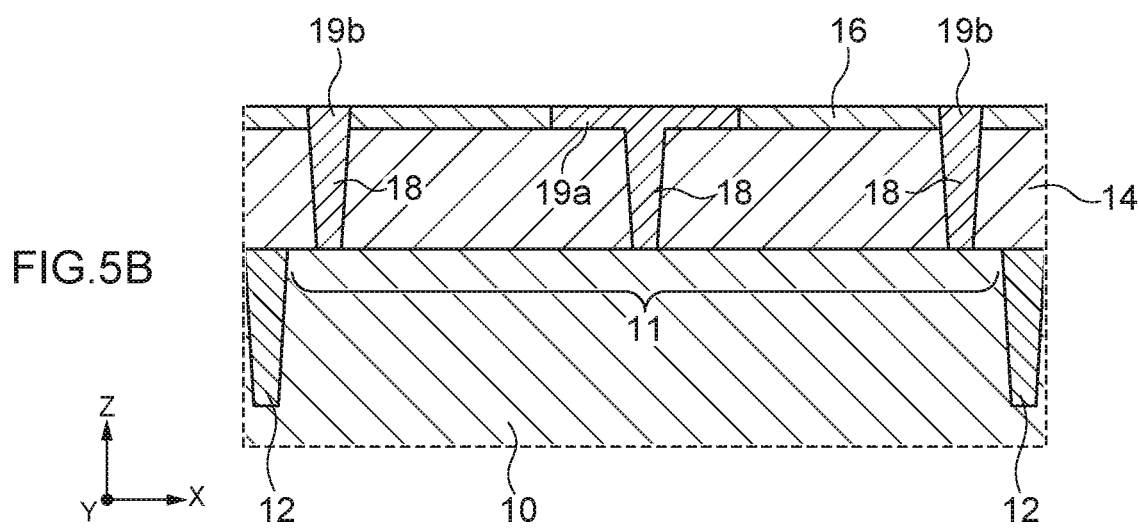

Next, as illustrated in FIGS. 5A and 5B, the first conductive film 17 is removed until the top face of the second insulating film 16 is exposed, and the contact electrodes 18 and the pad 19a are formed. Any of various method can be used to remove the first conductive film 17, and for example, the first conductive film 17 may be etched back, subjected to chemical mechanical polishing (hereinafter referred to as "CMP"), or a combination of the above may be used.

Figure 6A:
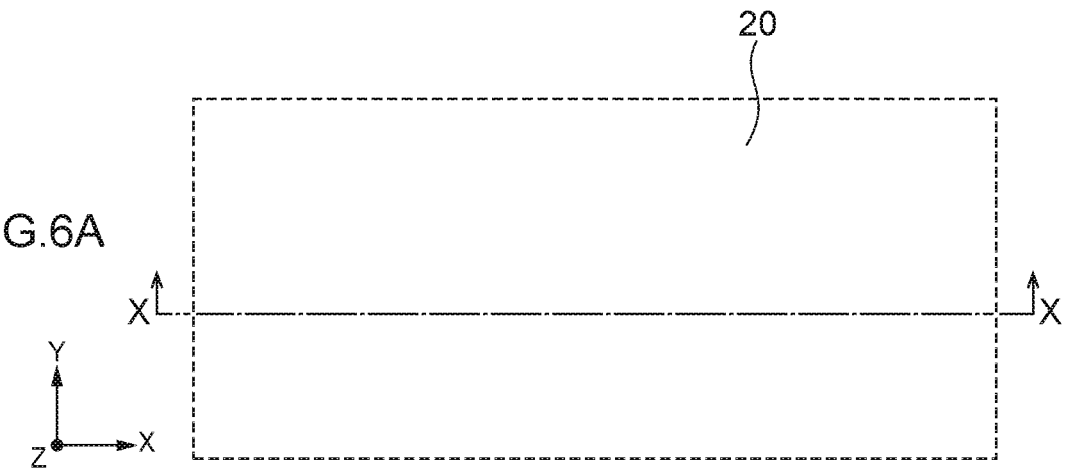
Figure 6B:
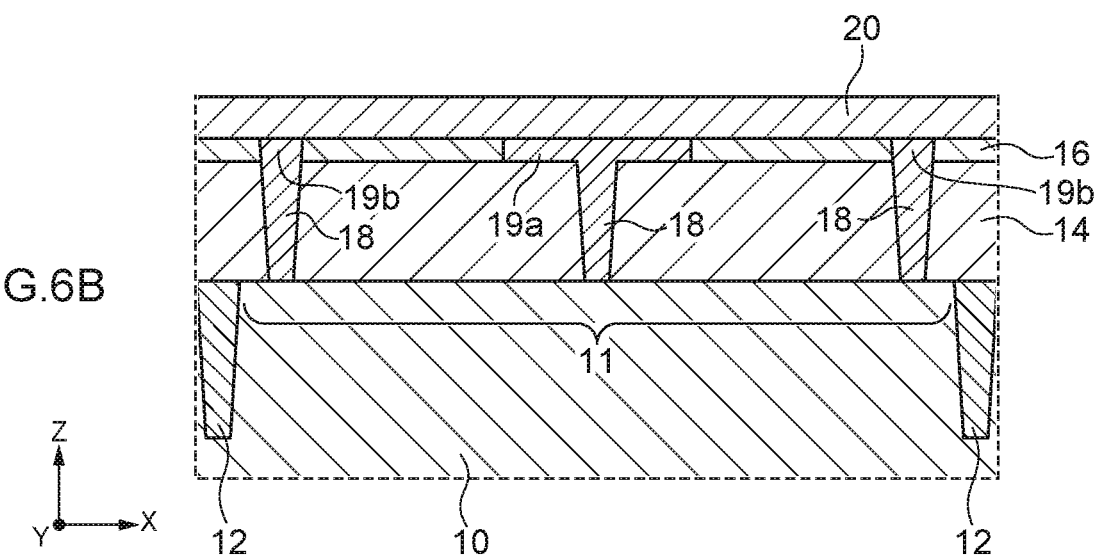

Next, as illustrated in FIGS. 6A and 6B, the third insulating film 20 is deposited. The third insulating film 20 contains silicon oxide (SiO). The third insulating film 20 is formed by CVD, for example.

Figure 7A:
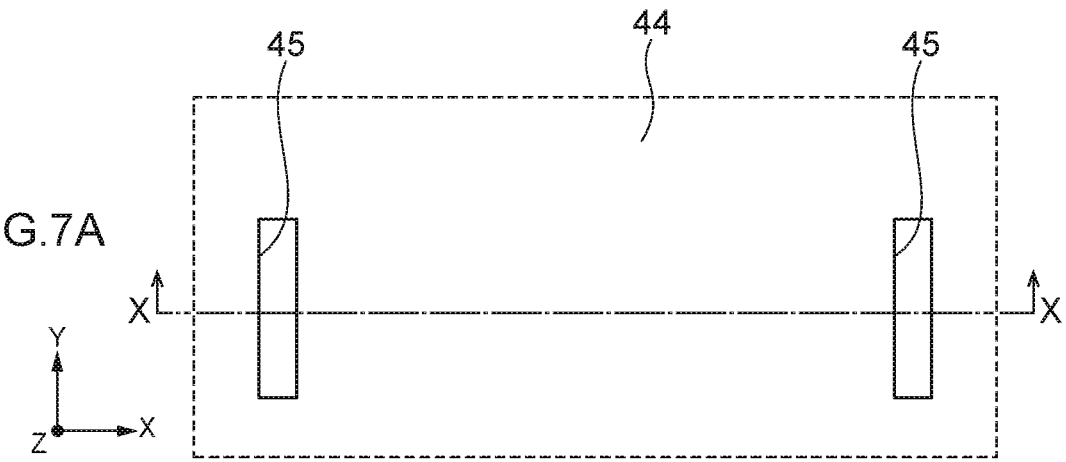
Figure 7B:
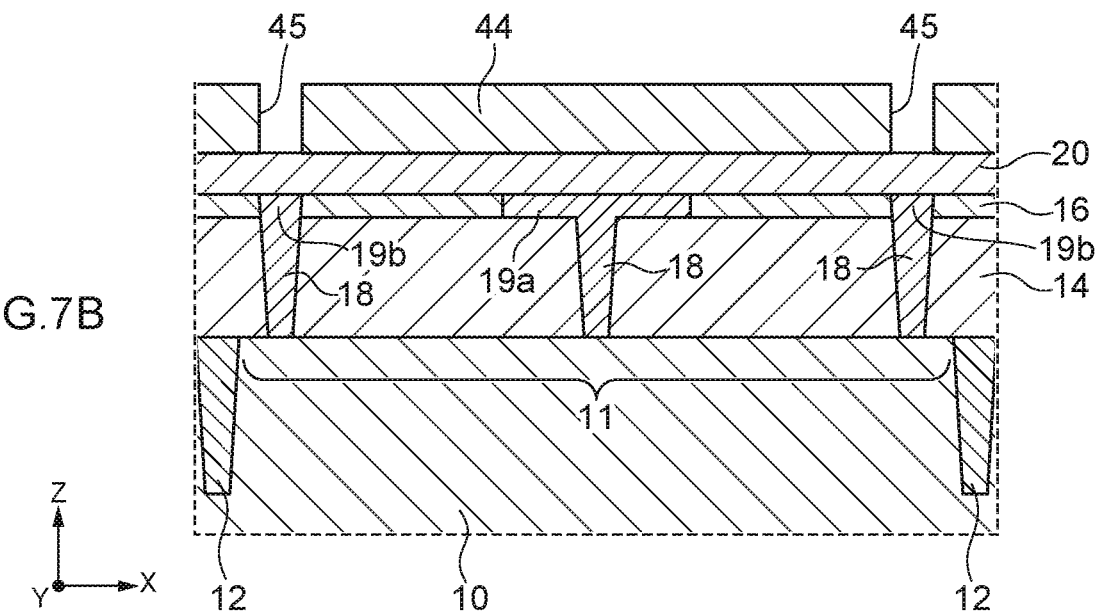

Next, as illustrated in FIGS. 7A and 7B, a photoresist 44 patterned with openings 45 is formed above the contact electrodes 18. The photoresist 44 is formed by lithography. Note that an opening 45 may also be provided above the contact electrode 18 where the pad 19a is formed.

Figure 8A:
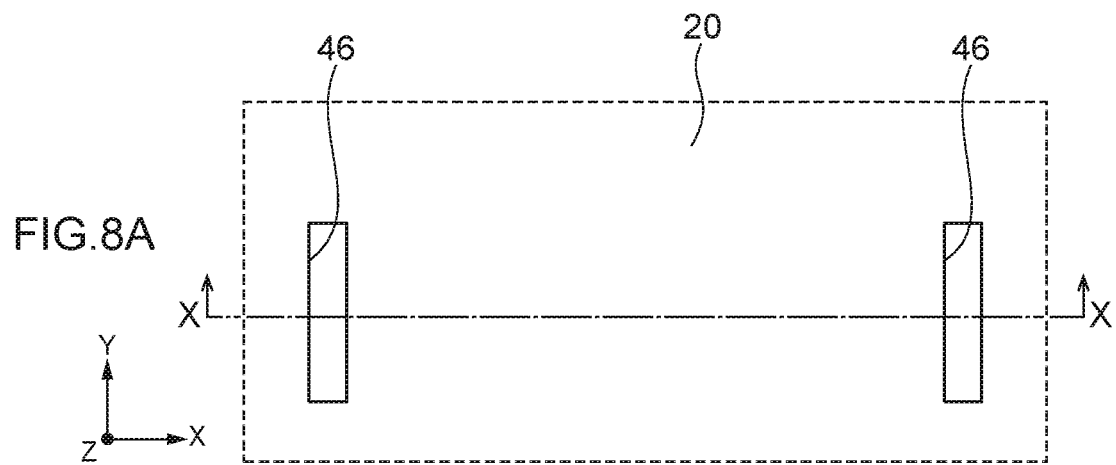
Figure 8B:
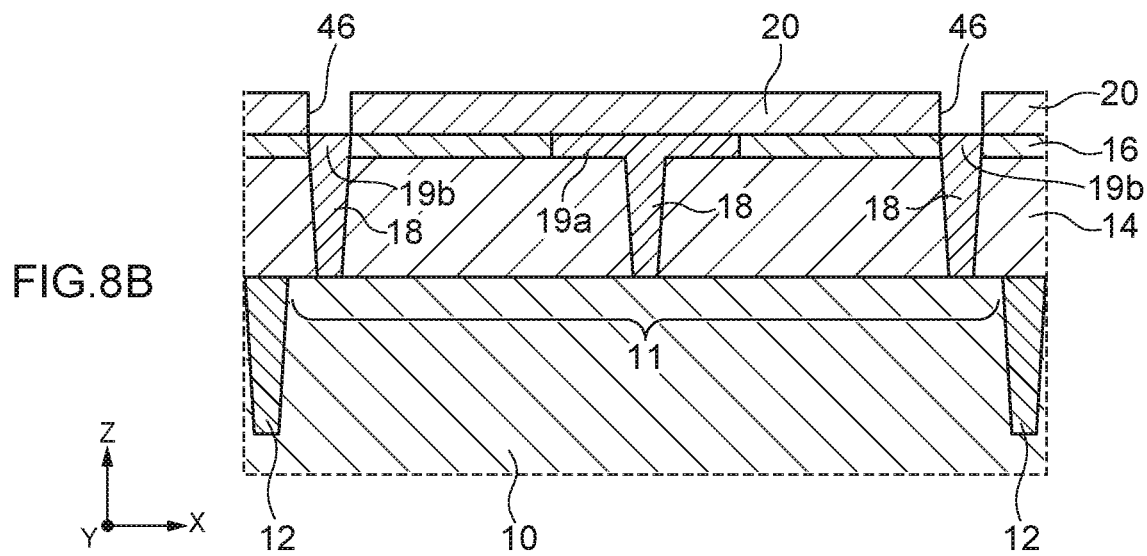

Next, as illustrated in FIGS. 8A and 8B, anisotropic dry etching is performed on the third insulating film 20 using the photoresist 44 as an etching mask, thereby forming in the third insulating film 20 openings 46 to which the pattern of the openings 45 is transferred. After that, the photoresist 44 is removed. In the openings 46, the top faces of the contact electrodes 18 are exposed.

Figure 9A:
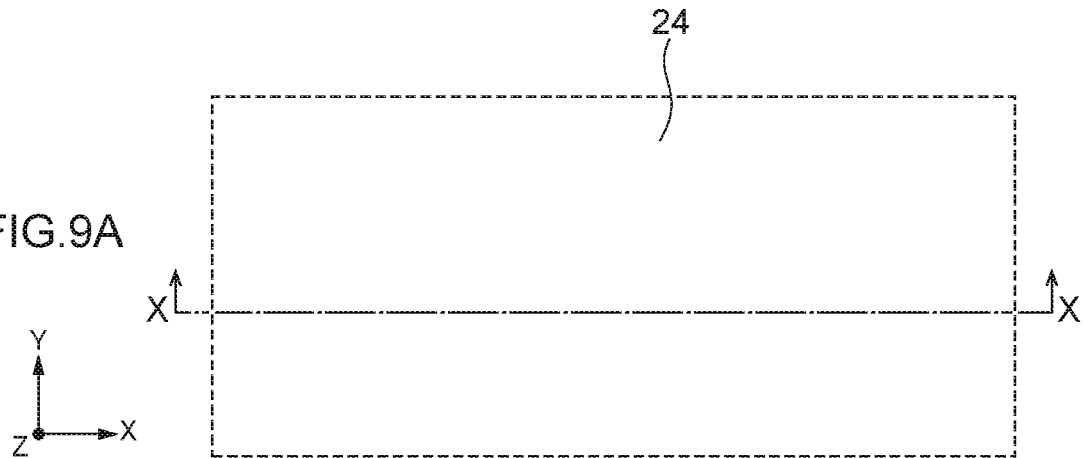
Figure 9B:
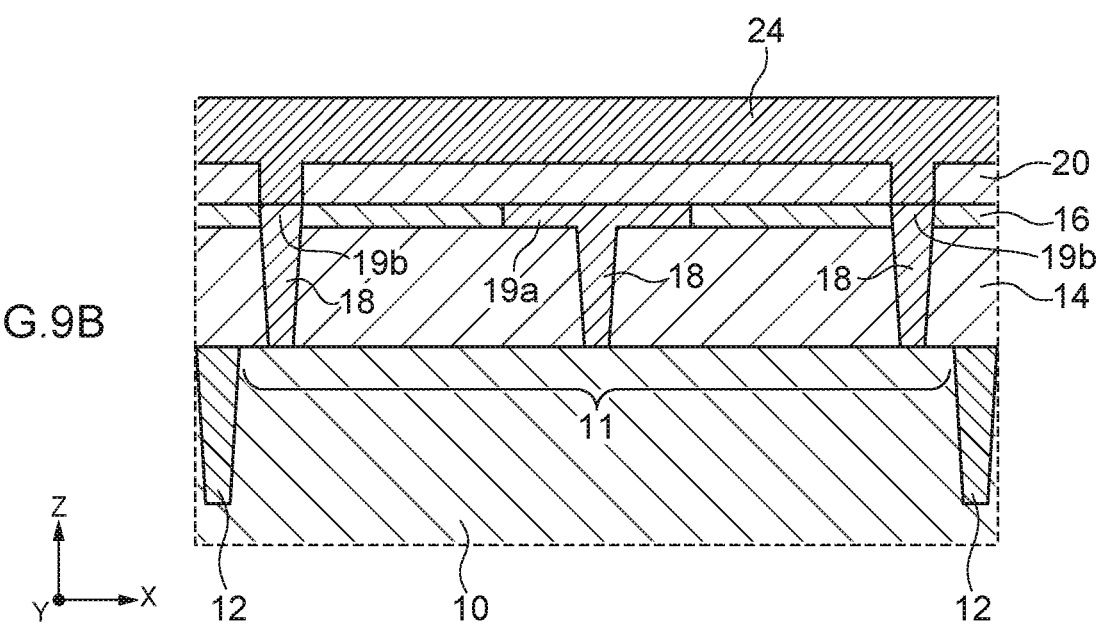

Next, as illustrated in FIGS. 9A and 9B, the first wiring layer 24 is formed so as to be embedded in the openings 46, and covering the top faces of the openings 46. The first wiring layer 24 contains a conductive material such as metal, for example. The first wiring layer 24 contains tungsten (W), for example. The first wiring layer 24 is formed by CVD, for example.

Figure 10A:
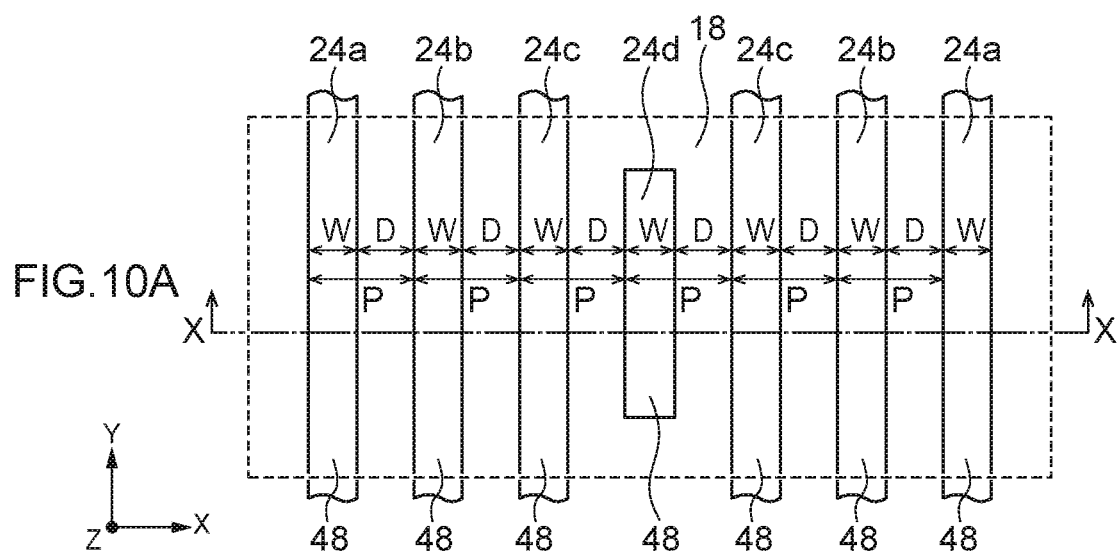
Figure 10B:
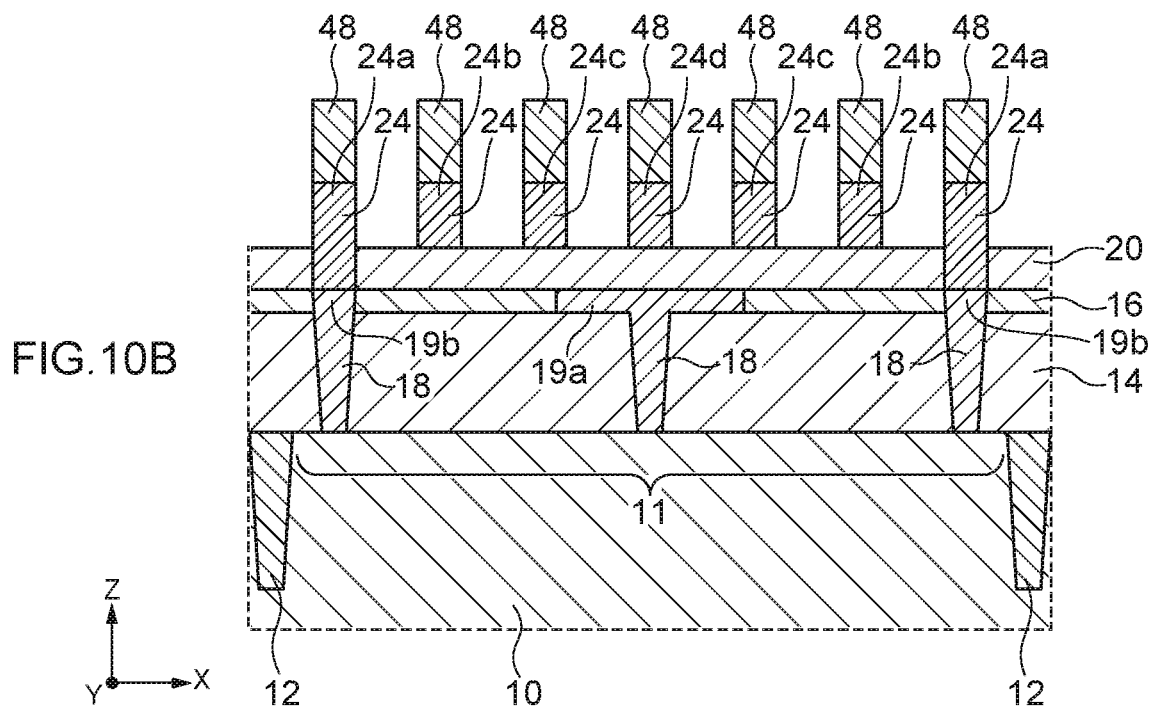

Next, as illustrated in FIGS. 10A and 10B, an etching mask 48 patterned on the first wiring layer 24 is formed. After that, anisotropic dry etching is performed on the first wiring layer 24 by using the etching mask 48 as a mask, thereby forming the first wiring layer 24 patterned in a line and space layout. The patterned first wiring layer 24 includes the first wirings 24a, the second wirings 24b, the third wirings 24c, and the fourth wiring 24d. The etching mask 48 and the patterned first wiring layer 24 (first wirings 24a, second wirings 24b, third wirings 24c, and fourth wiring 24d) are disposed to have the width W, the distance D, and a repeating pitch P. The etching mask 48 includes an insulating film and contains silicon nitride (SiN), for example. The etching mask 48 is patterned by using photoresist not illustrated that has been patterned by lithography as a mask.

Figure 11A:
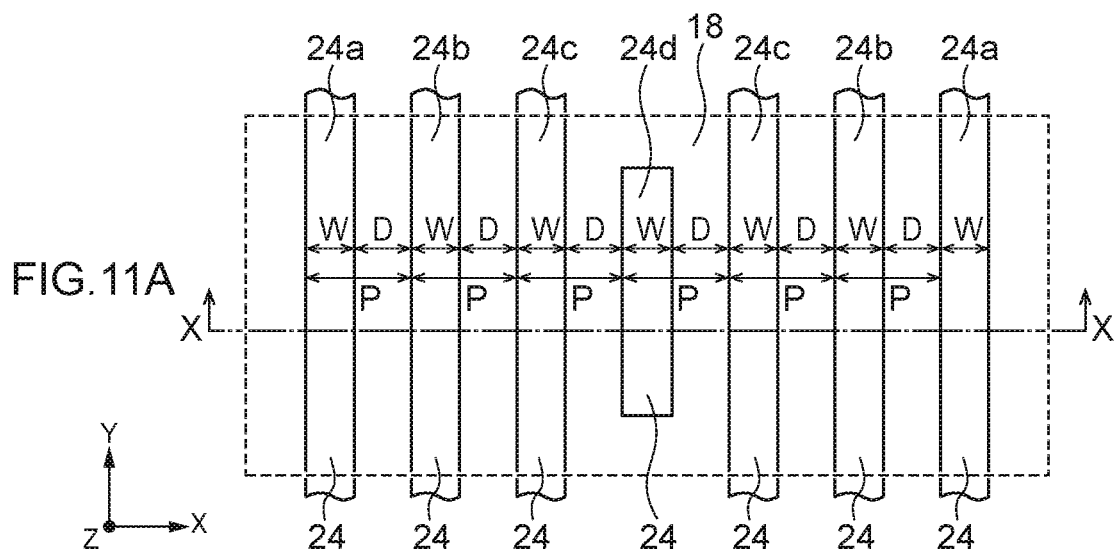
Figure 11B:
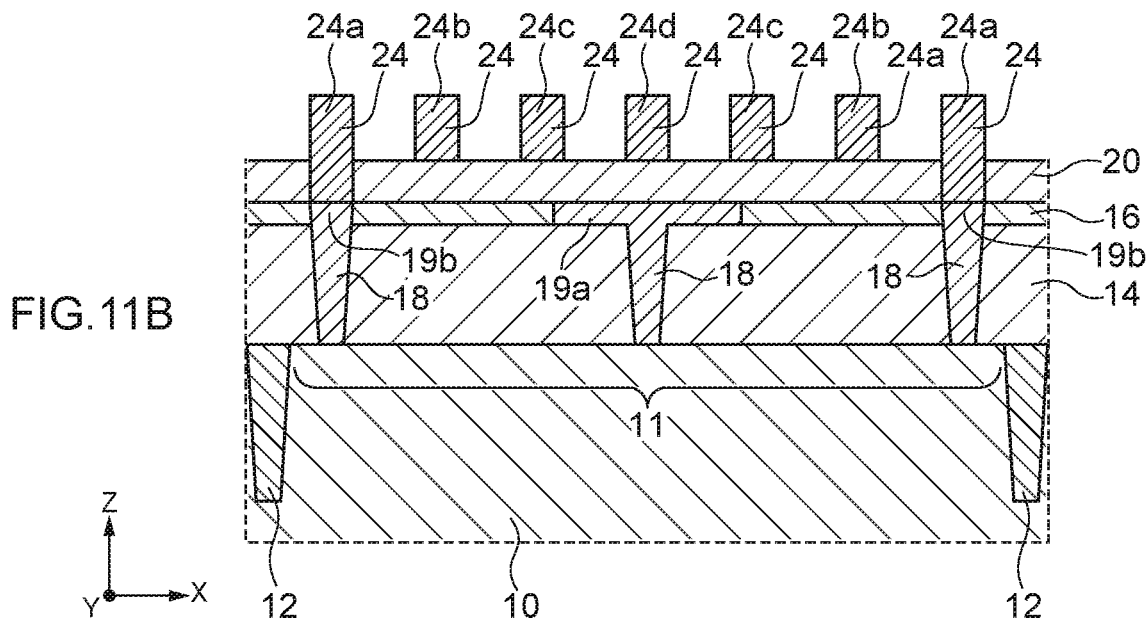

Next, as illustrated in FIGS. 11A and 11B, the etching mask 48 is removed. The etching mask 48 is removed by performing anisotropic dry etching under conditions having a higher selectivity ratio for the etching mask 48 compared to the first wiring layer 24 and the third insulating film 20, or by using hot phosphoric acid, for example.

Figure 12A:
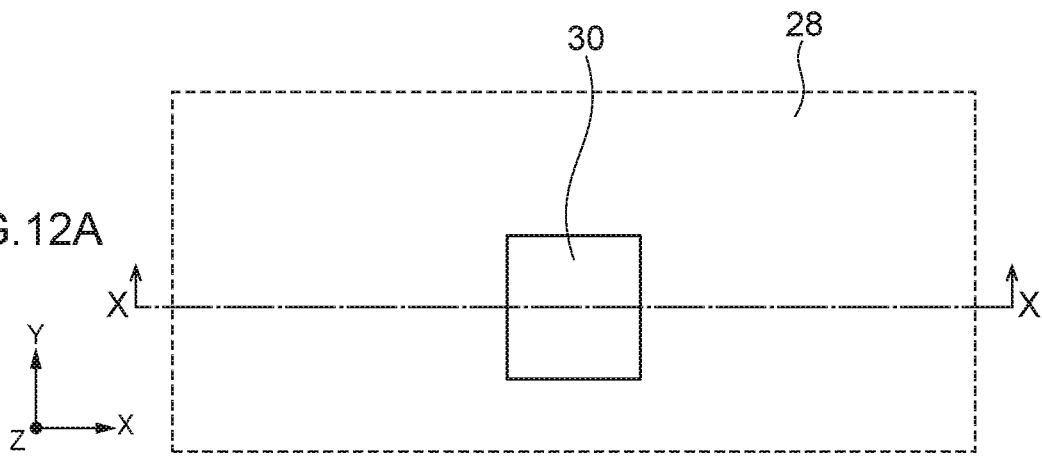
Figure 12B:
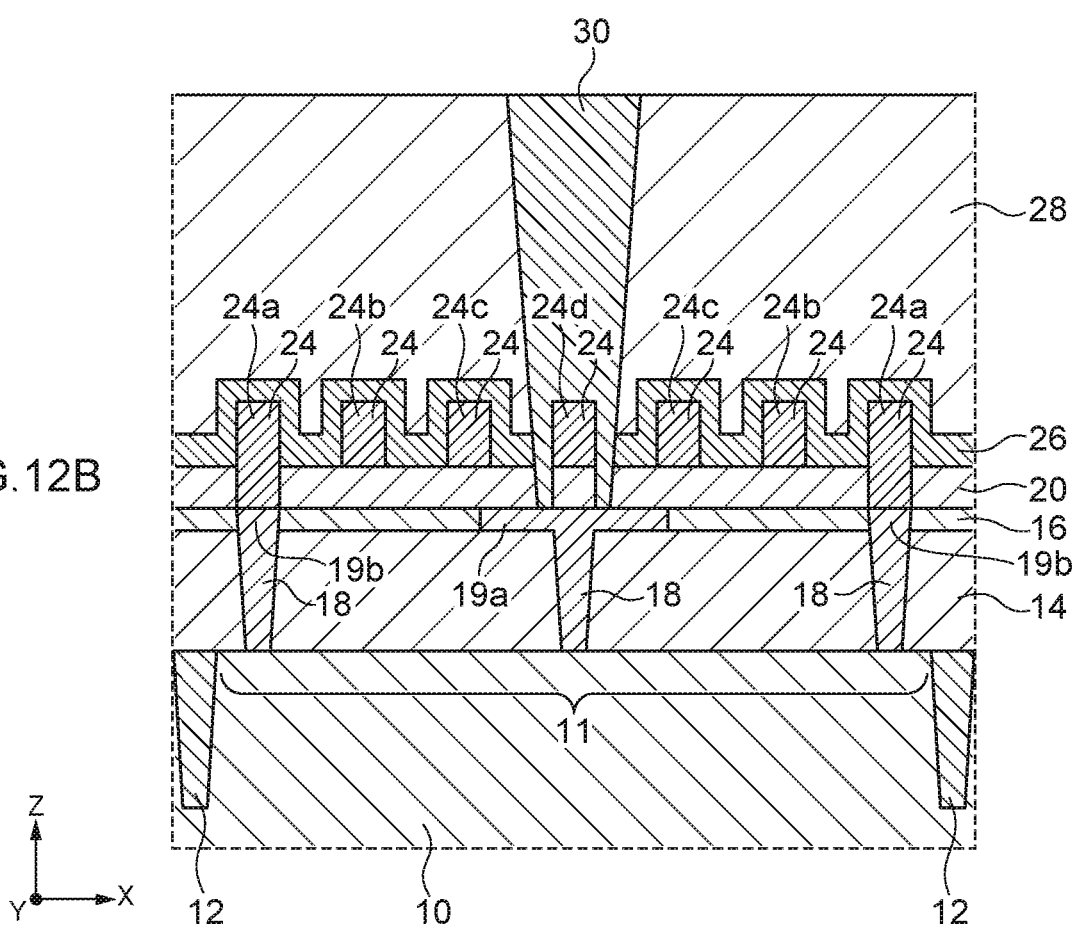

Next, as illustrated in FIGS. 12A and 12B, the fifth insulating film 26 is formed so as to cover the third insulating film 20 and the first wiring layer 24. The fifth insulating film 26 contains an insulating material such as silicon nitride (SiN), for example. The fifth insulating film 26 is formed using CVD, for example. Next, the sixth insulating film 28 is formed so as to cover the top face of the fifth insulating film 26. The sixth insulating film 28 contains an insulating material such as silicon oxide (SiO), for example. The sixth insulating film 28 is formed using CVD, for example.

Additionally, a hole that contacts the surface of the pad 19a is formed from the top face of the sixth insulating film 28, and by embedding a conductive material in the hole, the through-hole electrode 30 is formed. The through-hole electrode 30 abuts the top and side faces of the fourth wiring 24d. The through-hole electrode 30 contains a conductive material such as tungsten (W), for example. The through-hole electrode 30 is formed by subjecting tungsten deposited by CVD to etchback or CMP, for example. By contacting the fourth wiring 24d and the pad 19a, the through-hole electrode 30 provides electrical continuity between the fourth wiring 24d and the semiconductor substrate 10. Also, by having the through-hole electrode 30 contact the fourth wiring 24d and the pad 19a, the contact surface area is increased, and through-hole resistance can be lowered.

Next, as illustrated in FIGS. 1A and 1B, the wiring 32 that connects to the top face of the through-hole electrode 30 is formed. The wiring 32 contains a conductive material such as copper (Cu), for example. The copper is deposited by a plating method, for example. Through the above steps, the semiconductor device 1A according to the first embodiment is formed.

As above, the first wiring layer 24 and the pad 19a are formed in different conductive layers. The third insulating film 20 exists between the first wiring layer 24 and the pad 19a, thereby insulating the two from each other. Because the first wiring layer 24 does not exist in the horizontal direction of the pad 19a, the horizontal dimension of the pad 19a can be set in any way without contacting the first wiring layer 24. Additionally, the first wiring layer 24 and the pad 19a are patterned by different lithography steps. Because a state is achieved in which a short between the first wiring layer 24 and the pad 19a is avoided, the repeating pattern of the first wiring layer 24 can be patterned with the minimum dimensions, the minimum distance, and the minimum pitch achievable by lithography. Consequently, the line and space layout of the repeating pattern of the first wiring 24a, second wiring 24b, third wiring 24c, and fourth wiring 24d can be patterned with the minimum dimensions, the minimum distance, and the minimum pitch achievable by lithography. With this arrangement, the chip area of the semiconductor device 1A can be reduced, thereby obtaining the semiconductor device 1A with improved yield and lowered costs.

Second Embodiment

Next, a semiconductor device 1B according to the second embodiment will be described with reference to FIGS. 13A and 13B. In the following description, elements similar to the first embodiment are denoted with the same signs, and an explanation of such elements is omitted.

Figure 13A:
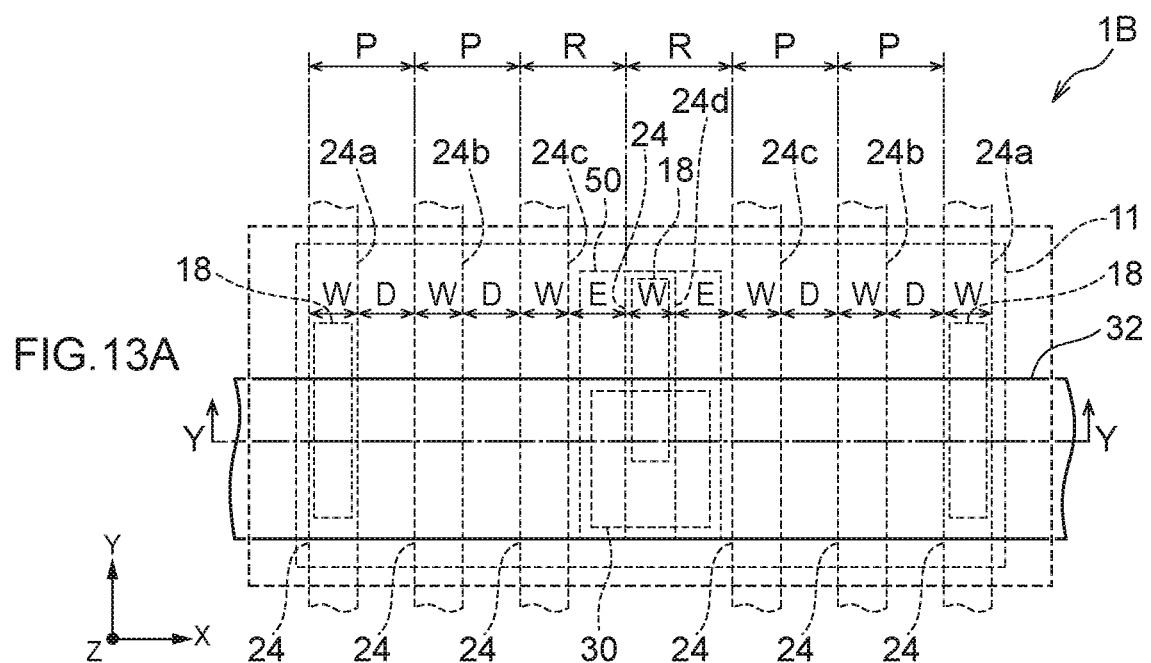
FIG. 13A is a plan view illustrating one example of a schematic configuration of the layout of a semiconductor wafer surface according to a second embodiment.

FIG. 13A is a plan view illustrating a schematic configuration of the semiconductor device 1B. FIG. 13A illustrates a portion of a peripheral circuit area of a DRAM memory cell, for example. As illustrated in FIG. 13A, the semiconductor device 1B is provided with a first wiring layer 24 on a semiconductor substrate 10. The first wiring layer 24 includes first wirings 24a, second wirings 24b, third wirings 24c, and a fourth wiring 24d. The first wirings 24a, second wirings 24b, and third wirings 24c are arranged in parallel at equal distances from each other in the X direction. The first wirings 24a, the second wirings 24b, and the third wirings 24c have a predetermined width W, and extend in the Y direction. The fourth wiring 24d has a predetermined width W and a predetermined length, and extends in the Y direction. The first wirings 24a, second wirings 24b, and third wirings 24c have a predetermined distance D between each other. A repeating pitch P of the first wirings 24a, second wirings 24b, and third wirings 24c is the sum (W+D) of the width W and the distance D.

In the semiconductor device 1B, a pad 50 is disposed so as to abut the bottom face of the fourth wiring 24d. An elongated contact electrode 18 smaller than the fourth wiring 24d is overlaid onto the pad 50. The top face of the pad 50 and the bottom face of the fourth wiring 24d are in direct contact. The contact electrode 18 is disposed below the pad 50, and the contact electrode 18 and the pad 50 are configured as an integrated piece. The horizontal dimension of the pad 50 is set larger than the fourth wiring 24d. A predetermined distance is provided between the pad 50 and each adjacent third wiring 24c to prevent a short between the two. A through-hole electrode 30 contacts the top and side faces of the fourth wiring 24d as well as the top face of the pad 50 on either side of the fourth wiring 24d. A distance E between the fourth wiring 24d and each adjacent third wiring 24c is larger than the distance D. Also, a repeating pitch R of the fourth wiring 24d and the third wirings 24c adjacent on either side of the fourth wiring 24d is larger than the repeating pitch P described above.

Figure 13B:
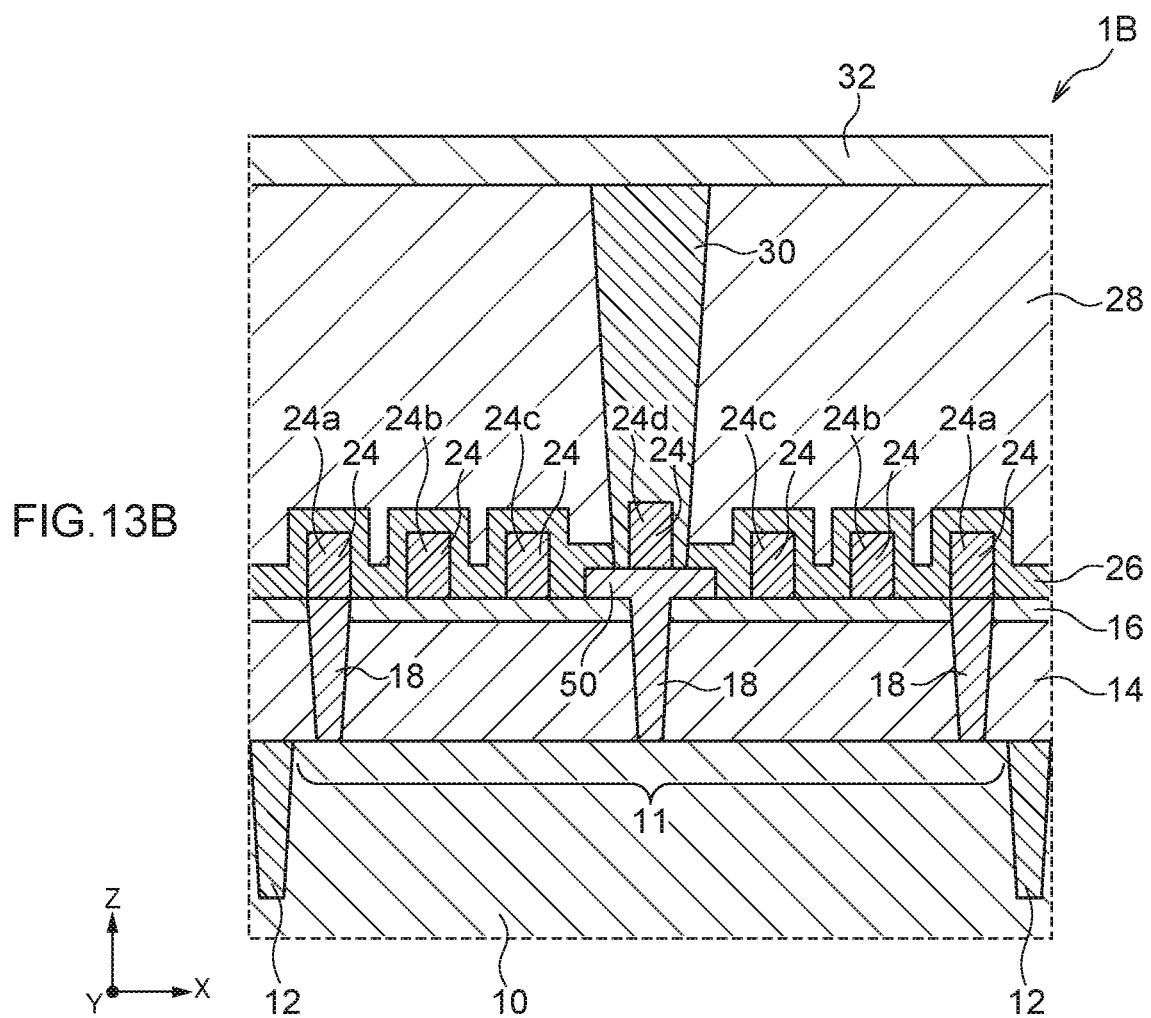
FIG. 13B is a diagram illustrating a semiconductor device according to the second embodiment and a method of forming the same, and illustrates one example of the schematic configuration in a final process stage.

FIG. 13B is a longitudinal section illustrating one example of the schematic configuration of a portion along the line Y-Y in FIG. 13A. A first insulating film 14 and a second insulating film 16 are provided on the semiconductor substrate 10, and the pad 50 is formed on the stack of the first insulating film 14 and the second insulating film 16. The pad 50 contains a metal such as tungsten (W), for example. The pad 50 is provided below the fourth wiring 24d. The position of the top face of the pad 50 is set to be higher than the position of the bottom faces of the wirings 24a, 24b, and 24c other than the fourth wiring 24d contacting the top face of the pad 50. The contact electrode 18 and the pad 50 are formed as one. The rest of the configuration is the same as the semiconductor device 1A according to the first embodiment.

Figure 14A:
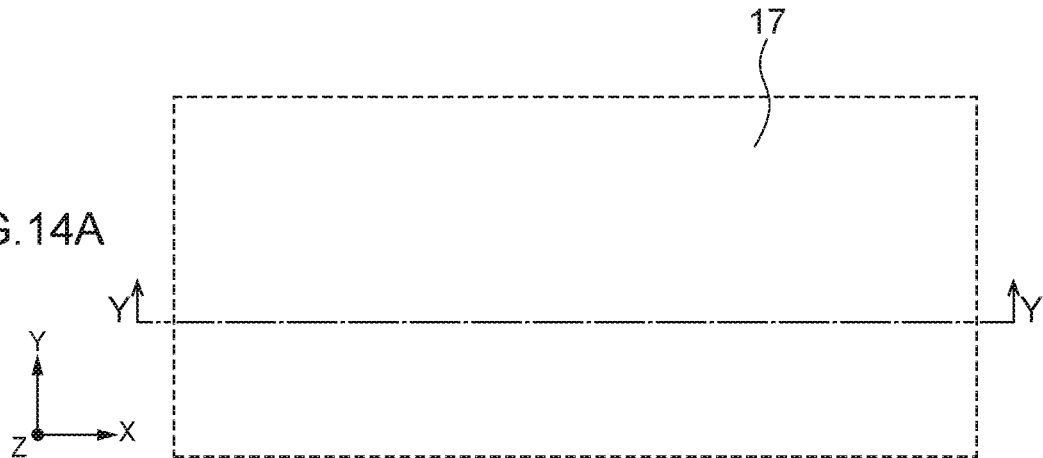
Figure 14B:
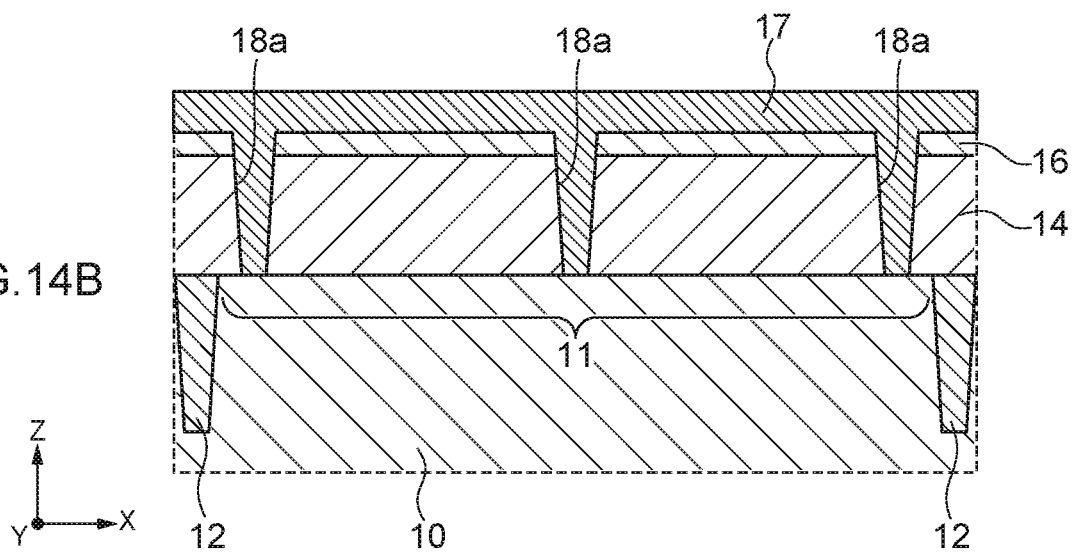

Next, a method of forming the semiconductor device 1B according to the second embodiment will be described with reference from FIGS. 13A and 13B to FIGS. 19A and 19B. First, as illustrated in FIGS. 14A and 14B, the element isolation 12 and the active portion 11 are formed in the semiconductor substrate 10, and the first insulating film 14 and the second insulating film 16 are formed. Thereafter, anisotropic dry etching is performed on the first insulating film 14 and the second insulating film 16 using a photomask not illustrated that has been formed by lithography, and contact holes 18a that reach the surface of the active portion 11 are formed. After that, the first conductive film 17 is formed so as to be embedded in the contact holes 18a, and covering the top face of the second insulating film 16.

Figure 15A:
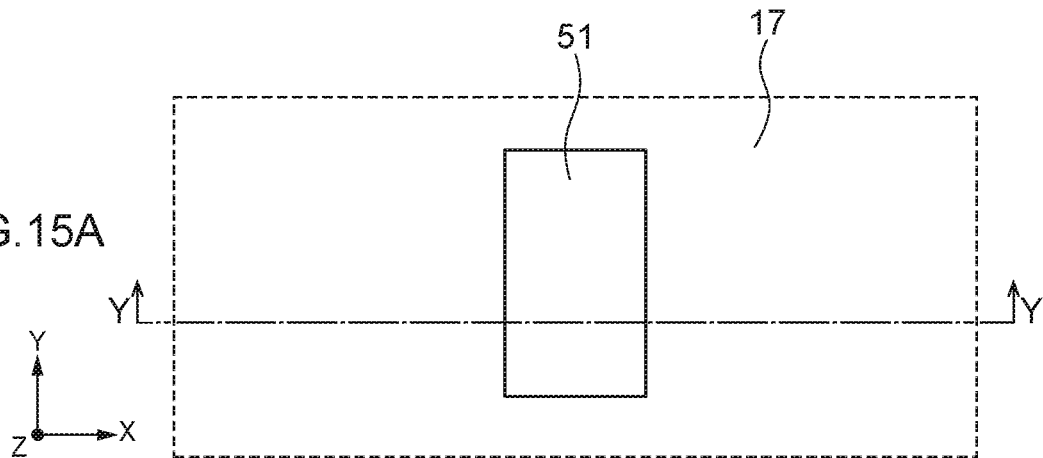
Figure 15B:
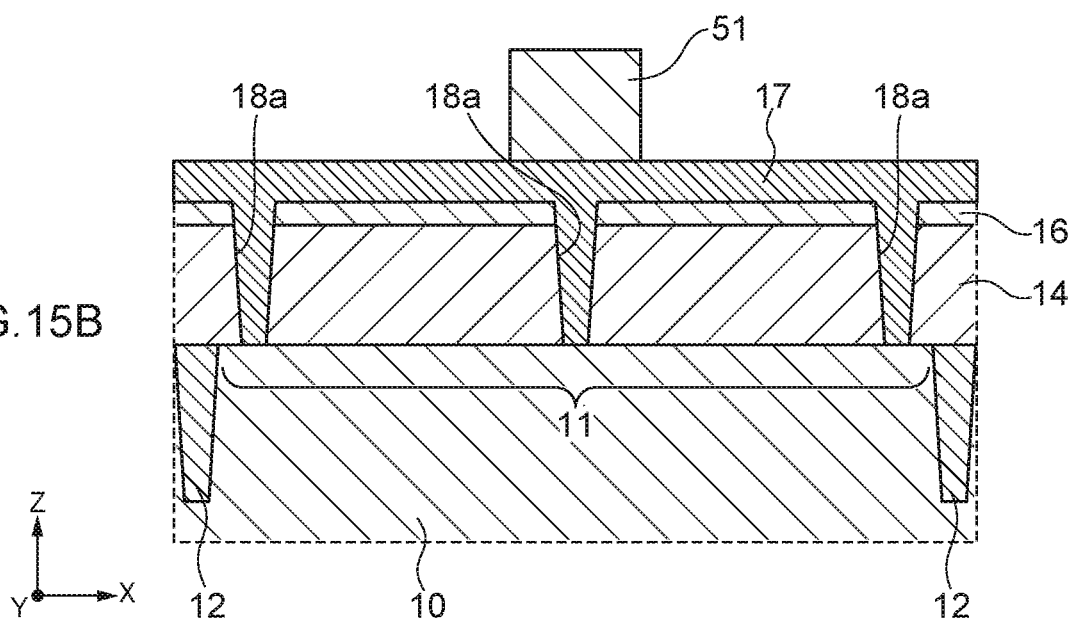
Figure 16A:
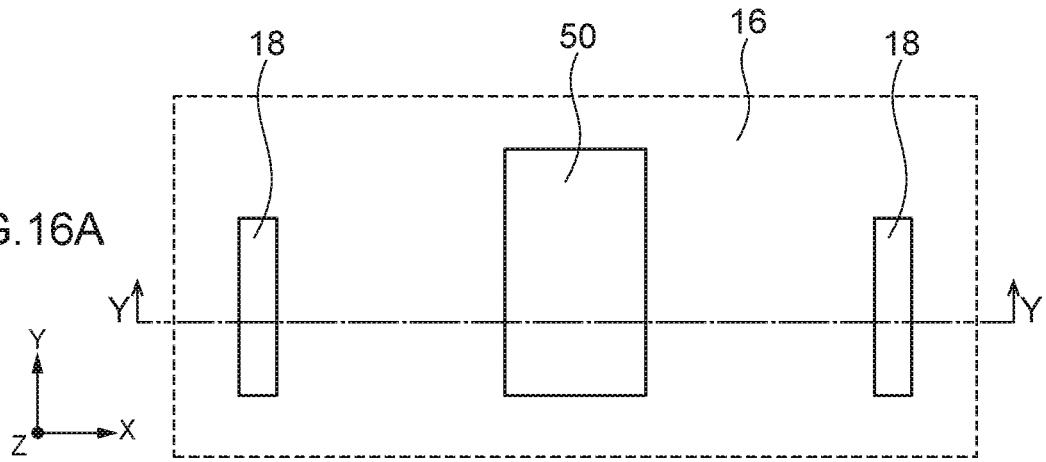
Figure 16B:
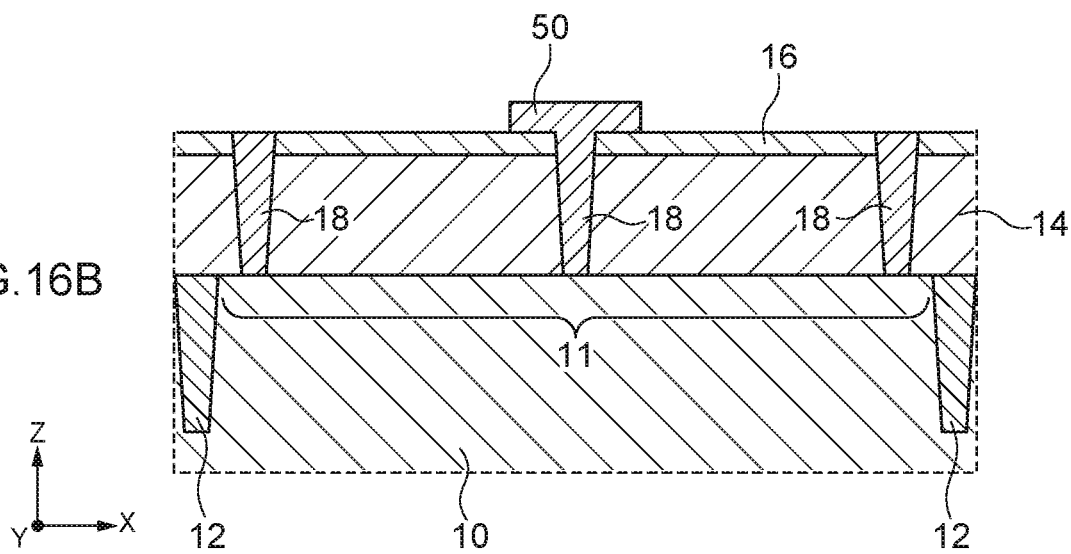

Next, as illustrated in FIGS. 15A and 15B, lithography is used to form a photoresist 51 on the first conductive film 17. The photoresist 51 corresponds to the shape of the pad 50 to be formed later. Next, as illustrated in FIGS. 16A and 16B, dry etching is performed using the photoresist 51 as an etching mask to pattern the first conductive film 17 and form the pad 50. A contact electrode 18 is formed integrally in a lower portion of the pad 50. Also, by proceeding with etching until the surface of the second insulating film 16 is exposed in the region where the photoresist 51 does not exist, the first conductive film 17 is left inside the contact holes 18a, and the contact electrodes 18 are formed.

Figure 17A:
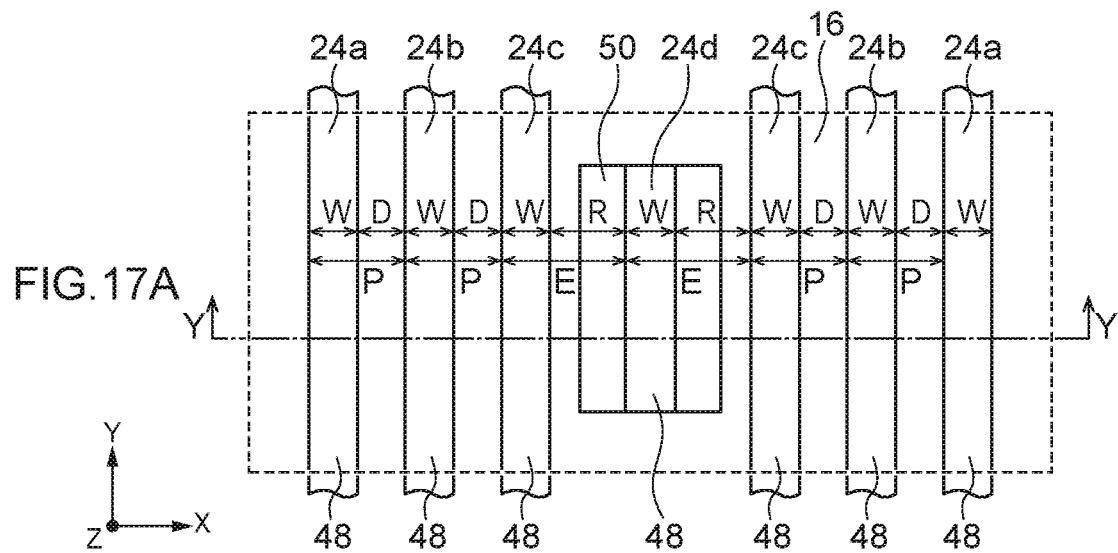
Figure 17B:
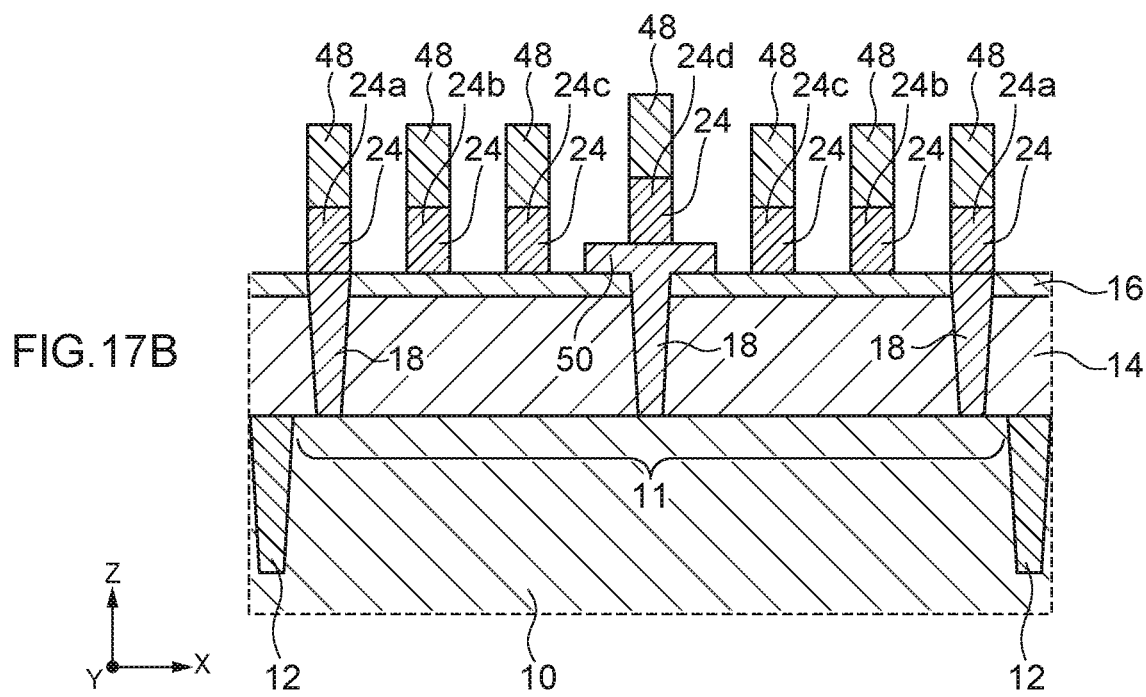

Next, as illustrated in FIGS. 17A and 17B, an etching mask 48 patterned on the first wiring layer 24 is formed, and anisotropic dry etching is performed on the first wiring layer 24 using the etching mask 48 as a mask. With this arrangement, the first wiring layer 24 patterned in a line and space layout is formed. The etching mask 48 and the patterned first wiring layer 24 include the first wirings 24a, the second wirings 24b, the third wirings 24c, and the fourth wiring 24d. The first wirings 24a, second wirings 24b, and third wirings 24c have a predetermined distance D between each other. A repeating pitch P of the first wirings 24a, second wirings 24b, and third wirings 24c is the sum (W+D) of the width W and the distance D.

Because the pad 50 and the third wirings 24c are positioned on the second insulating film 16 in an adjacent positional relationship, if the pad 50 is mispositioned, there is a possibility of a short occurring between the pad 50 and the third wiring 24c. A predetermined distance is provided between the pad 50 and each adjacent third wiring 24c to prevent a short between the two. Consequently, the distance E between the fourth wiring 24d and each adjacent third wiring 24c is larger than the distance D. Also, for this reason, the repeating pitch R of the fourth wiring 24d and the third wirings 24c adjacent thereto is slightly larger than the repeating pitch P described above.

Figure 18A:
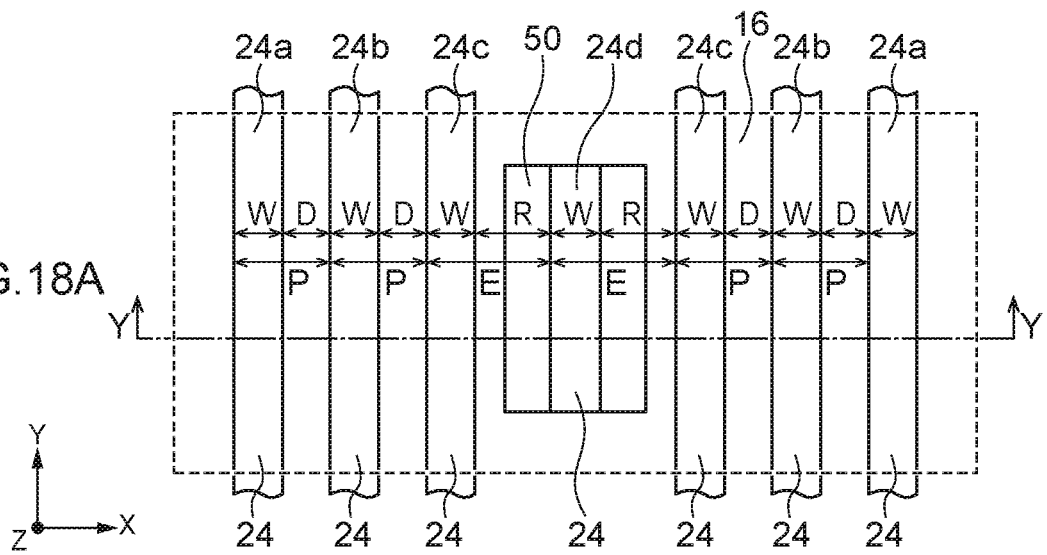
Figure 18B:
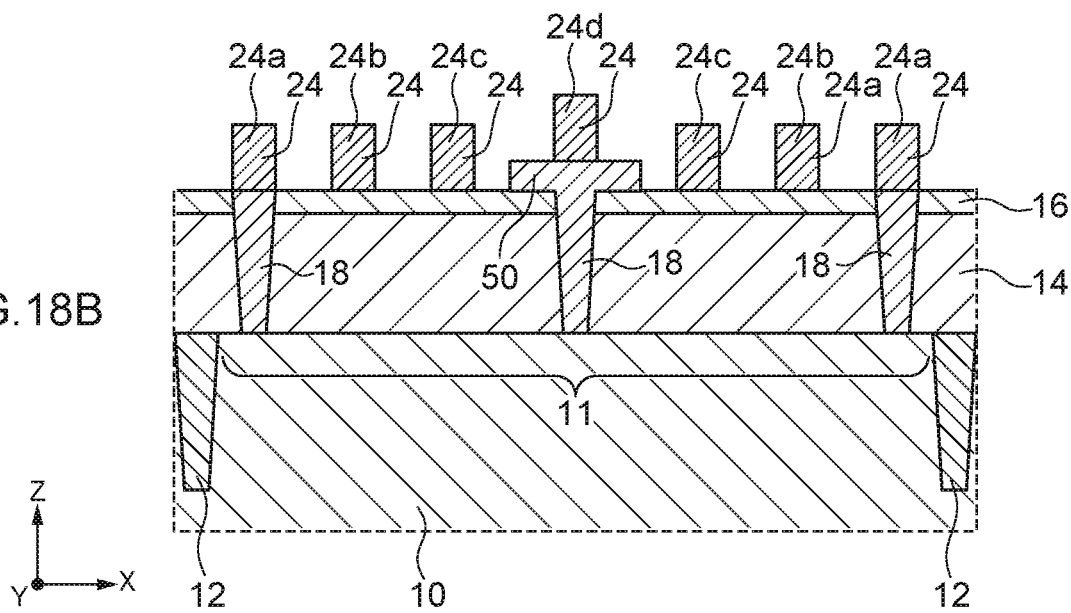
Figure 19A:
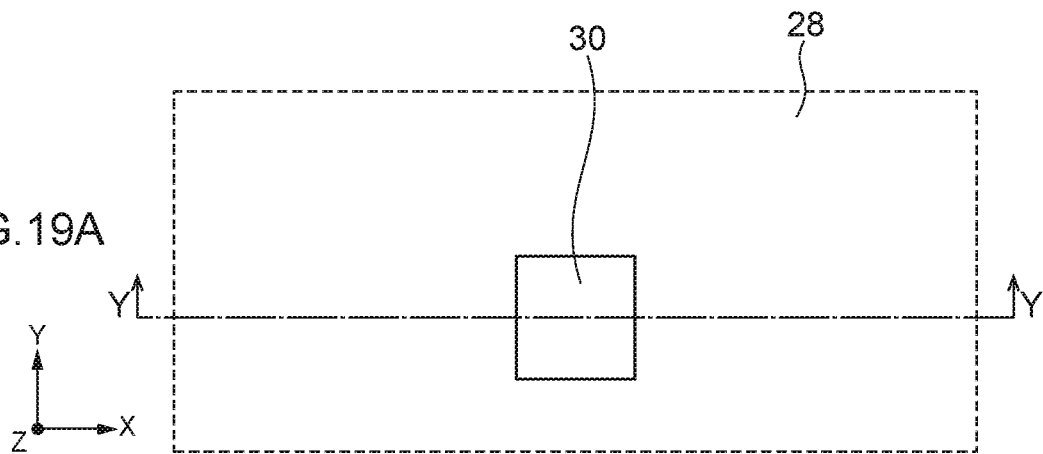
Figure 19B:
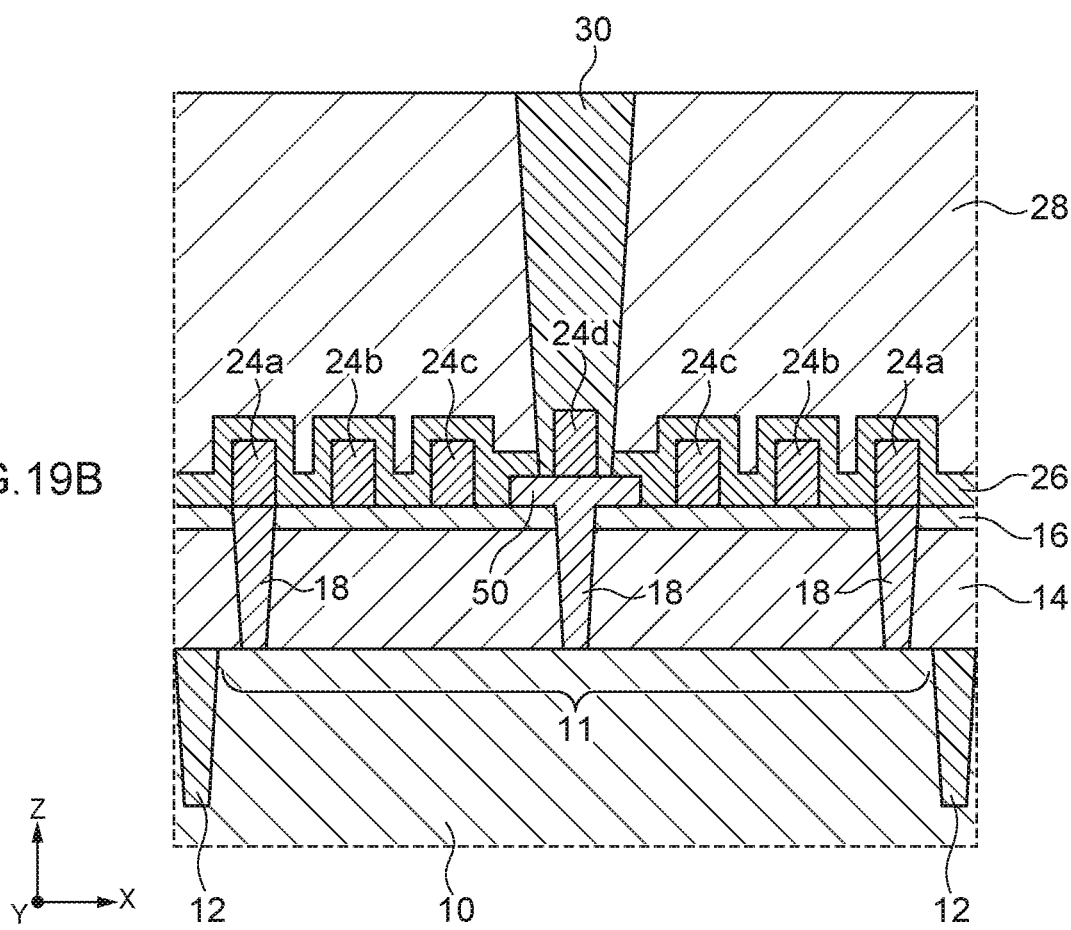

Next, as illustrated in FIGS. 18A and 18B, the etching mask 48 is removed. Next, as illustrated in FIGS. 19A and 19B, the fifth insulating film 26 is formed so as to cover the second insulating film 16, the first wiring layer 24, and the pad 50. Next, the sixth insulating film 28 is formed so as to cover the top face of the fifth insulating film 26. Additionally, a hole that reaches the surface of the pad 50 is formed from the top face of the sixth insulating film 28, and by embedding a conductive material in the hole, the through-hole electrode 30 is formed. The through-hole electrode 30 abuts the top and side faces of the fourth wiring 24d, and the top face of the pad 50. By having the through-hole electrode 30 contact the fourth wiring 24d and the pad 50, the contact surface area is increased, and through-hole resistance can be lowered. Next, as illustrated in FIGS. 13A and 13B, the wiring 32 that connects to the top face of the through-hole electrode 30 is formed. Through the above steps, the semiconductor device 1B according to the second embodiment is formed.

According to the semiconductor device 1B according to the second embodiment and a method of forming the same, the patterning of the pad 50 and the patterning of the first wiring layer 24 are performed by different lithographic processes, as described above. In the patterning of the first wiring layer 24, the patterning of the first wirings 24a, the second wirings 24b, the third wirings 24c, and the fourth wiring 24d can be achieved while also keeping the repeating pitch as small as possible within a range that allows a positioning margin to be secured with respect to the pad 50. Consequently, in the patterning of the first wiring layer 24, the distance between the fourth wiring 24d and the third wirings 24c adjacent thereto is increased slightly, and this portion makes the repeating pitch slightly larger than the first embodiment. However, the distance between the third wirings 24c and the fourth wiring 24d can be set smaller than in the case of patterning the pad 50 and the fourth wiring 24d as a single pattern. With this arrangement, the chip area of the semiconductor device 1B can be reduced, thereby obtaining the semiconductor device 1B with improved yield and lowered costs. Furthermore, because the number of lithography steps is reduced compared to the method according to the first embodiment, costs can be lowered.

Third Embodiment

Next, a semiconductor device 1C according to the third embodiment will be described with reference to FIGS. 20A and 20B. In the following description, elements similar to the first embodiment and the second embodiment are denoted with the same signs, and an explanation of such elements is omitted.

Figure 20A:
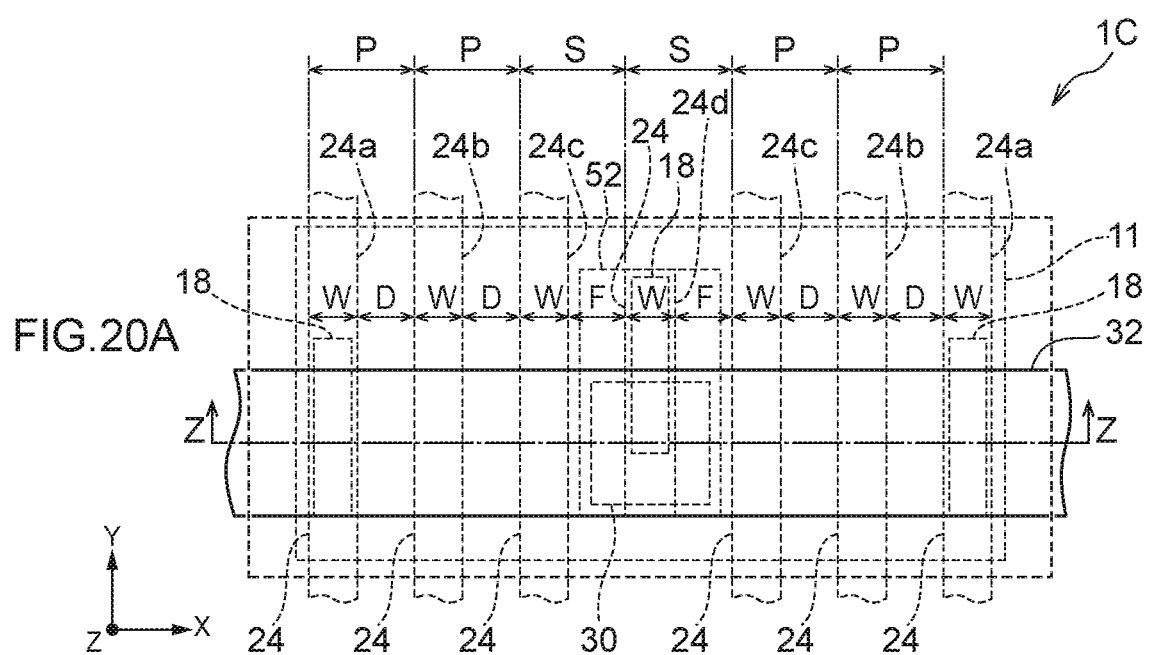
FIG. 20A is a plan view illustrating one example of a schematic configuration of the layout of a semiconductor wafer surface according to a third embodiment.

FIG. 20A is a plan view illustrating a schematic configuration of the semiconductor device 1C. FIG. 20A illustrates a portion of a peripheral circuit area of a DRAM memory cell, for example. FIG. 20B is a longitudinal section illustrating one example of the schematic configuration of a portion along the line Z-Z in FIG. 20A. As illustrated in FIGS. 20A and 20B, the semiconductor device 1C is provided with a first wiring layer 24 on a semiconductor substrate 10. The first wiring layer 24 includes first wirings 24a, second wirings 24b, third wirings 24c, and a fourth wiring 24d. The first wirings 24a, second wirings 24b, and third wirings 24c are arranged in parallel at equal distances from each other in the X direction. The first wirings 24a, the second wirings 24b, and the third wirings 24c have a predetermined width W, and extend in the Y direction. The fourth wiring 24d has the predetermined width W and a predetermined length, and extends in the Y direction. The first wirings 24a, second wirings 24b, and third wirings 24c have a predetermined distance D between each other. A repeating pitch P of the first wiring 24a, second wiring 24b, and third wiring 24c is the sum (W+D) of the width W and the distance D.

In the semiconductor device 1C, a pad 52 is disposed so as to abut the bottom face of the fourth wiring 24d. The position of the top face of the pad 52 is set to be substantially the same as the position of the bottom faces of the first wirings 24a, the second wirings 24b, the third wirings 24c, and the fourth wirings 24d. An elongated contact electrode 18 slightly smaller than the fourth wiring 24d is overlaid onto the pad 52. The top face of the pad 52 and the bottom face of the fourth wiring 24d are in direct contact. The contact electrode 18 is disposed below the pad 52, and the contact electrode 18 and the pad 52 are configured as an integrated piece. The dimension in the X direction of the pad 52 is set larger than the fourth wiring 24d.

Because the position of the top face of the pad 52 is aligned with the position of the bottom face of the first wiring layer 24, if the pad 52 is enlarged in the X direction, there is a possibility of a short occurring between the pad 52 and the third wiring 24c. Consequently, a predetermined distance is provided between the pad 52 and each adjacent third wiring 24c to prevent a short between the two.

A through-hole electrode 30 contacts the top and side faces of the fourth wiring 24d as well as the top face of the pad 52 on either side of the fourth wiring 24d. A distance F between the fourth wiring 24d and each adjacent third wiring 24c is larger than the distance D. Also, a repeating pitch S of the fourth wiring 24d and the third wirings 24c adjacent on either side of the fourth wiring 24d is larger than the repeating pitch P described above.

The first insulating film 14 and the second insulating film 16 are provided on the semiconductor substrate 10, and the pad 52 is embedded in an opening formed in the second insulating film 16. The pad 52 is disposed in a layer that overlaps with the second insulating film 16. The pad 52 contains a metal such as tungsten (W), for example. The pad 52 is provided below the fourth wiring 24d. The contact electrode 18 and the pad 52 are formed as one. Pads 19b disposed in a layer that overlaps with the second insulating film 16 are disposed in upper portions of the contact electrodes 18 connected to the first wirings 24a. The first wirings 24a and the pads 19b contact each other. The width of the pads 19b is narrower than the width of the pad 52. The rest of the configuration is the same as the semiconductor device 1B according to the second embodiment.

Next, a method of forming the semiconductor device 1C according to the third embodiment will be described with reference from FIGS. 20A and 20B to FIGS. 27A and 27B. As illustrated in FIGS. 21A and 21B, the element isolation 12 and the active portion 11 are formed in the semiconductor substrate 10, and the first insulating film 14 and the second insulating film 16 are formed. Thereafter, anisotropic dry etching is performed on the first insulating film 14 and the second insulating film 16 using a photomask that has been formed by lithography, and contact holes 18a that reach the surface of the active portion 11 are formed.

Thereafter, a seventh insulating film 34 is formed inside the contact holes 18a and on the second insulating film 16. Additionally, a mask insulating film 36 is formed on the seventh insulating film 34. A photoresist 54 having an opening 56 formed therein by lithography is formed on the mask insulating film 36. The opening 56 formed in the photoresist 54 corresponds to the shape of the pad 52 to be formed later.

Figure 22A:
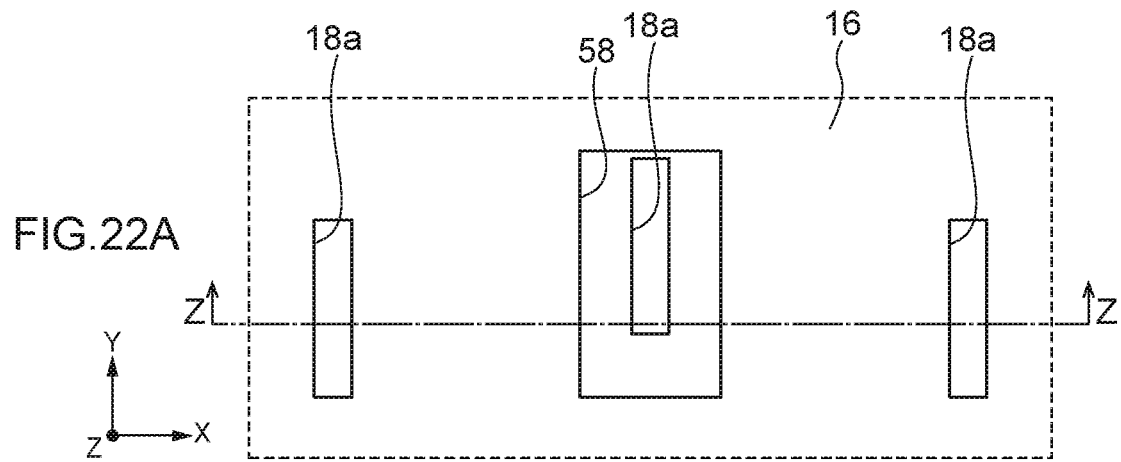
Figure 22B:
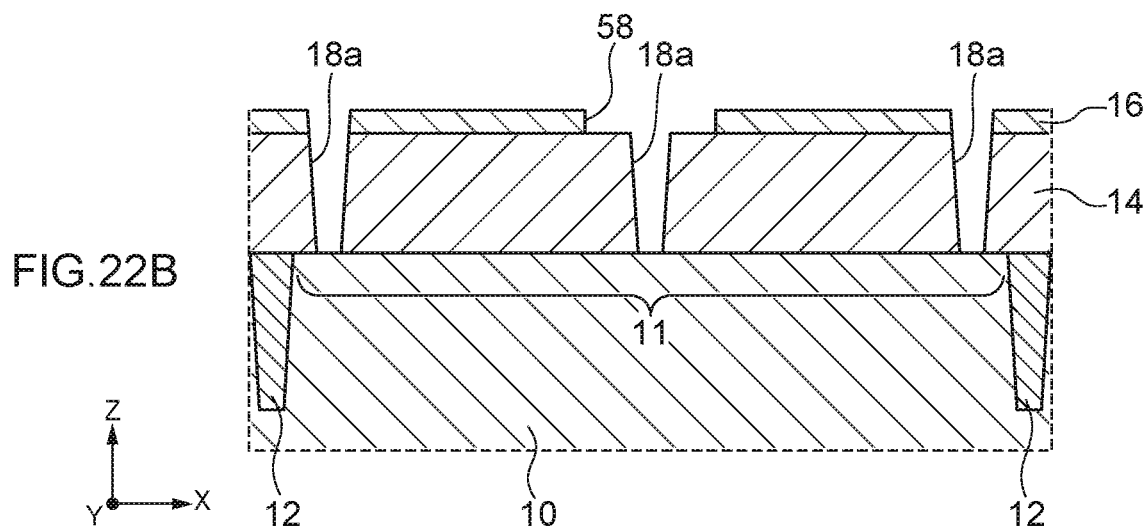

Next, as illustrated in FIGS. 22A and 22B, dry etching is performed using the photoresist 54 as an etching mask to pattern the mask insulating film 36. Additionally, the patterned mask insulating film 36 is used as an etching mask to pattern the second insulating film 16 and form an opening 58 to which the opening 56 is transferred. After that, the seventh insulating film 34 and the mask insulating film 36 are removed to expose the contact hole 18a and the first insulating film 14 in the opening 58, and the surface of the second insulating film 16.

Figure 23A:
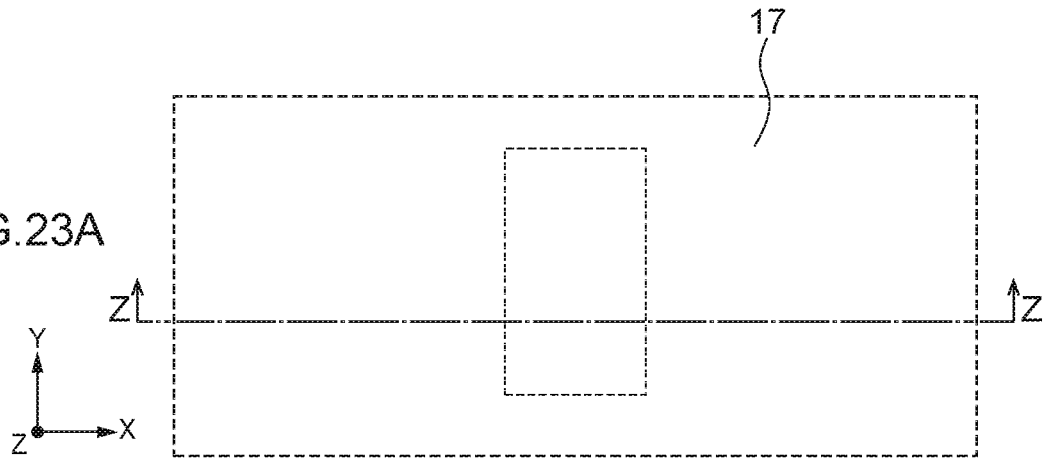
Figure 23B:
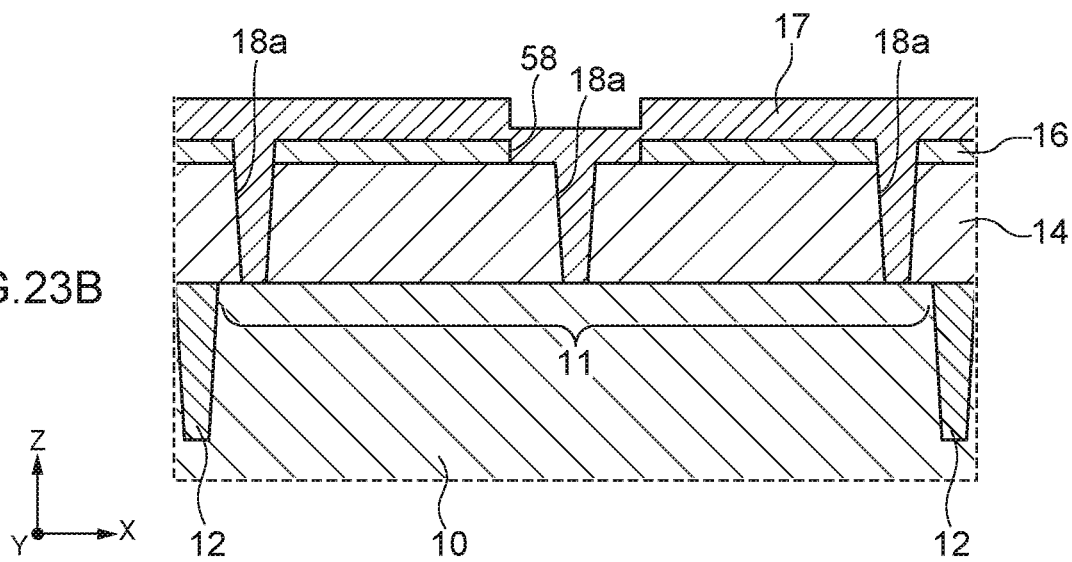
Figure 24A:
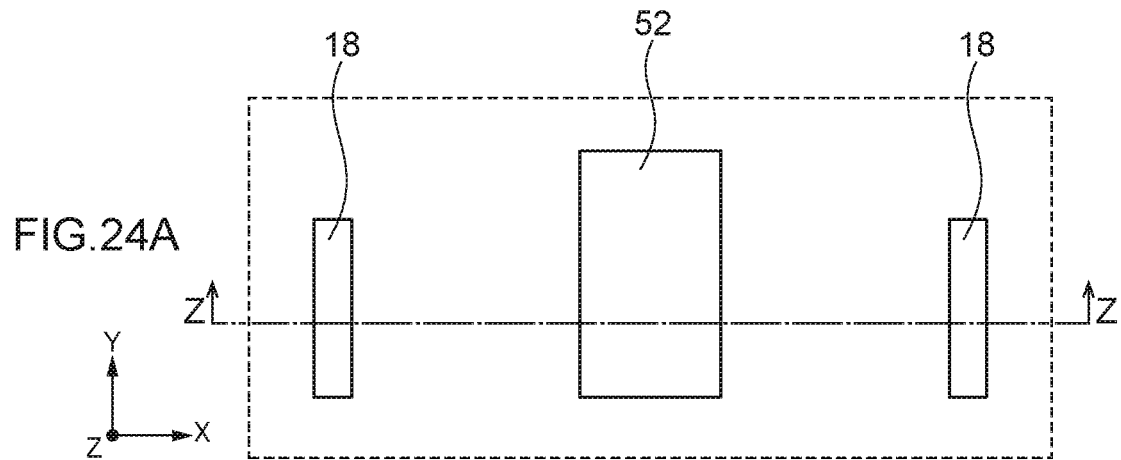
Figure 24B:
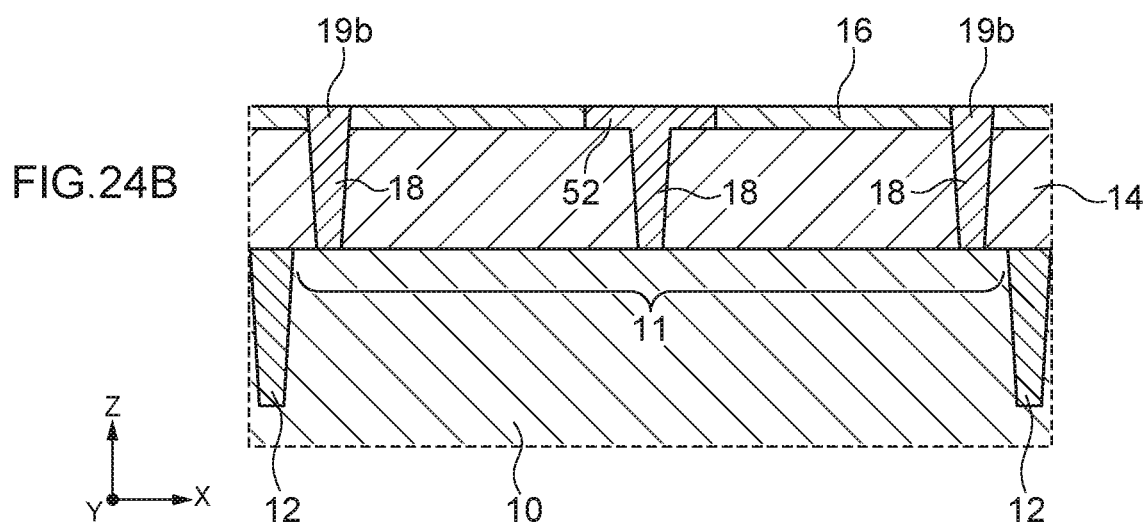
Figure 25A:
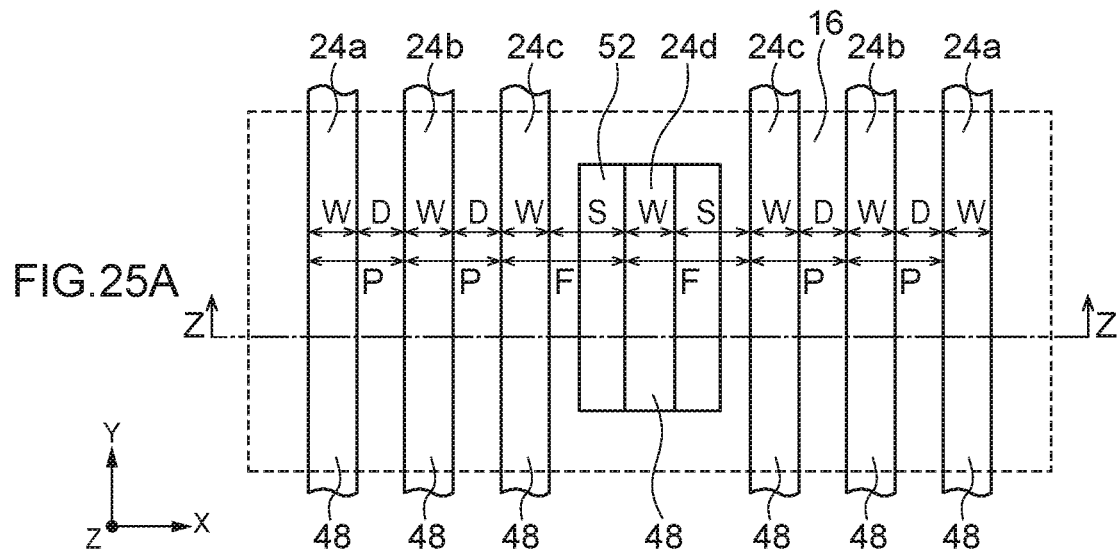
Figure 25B:
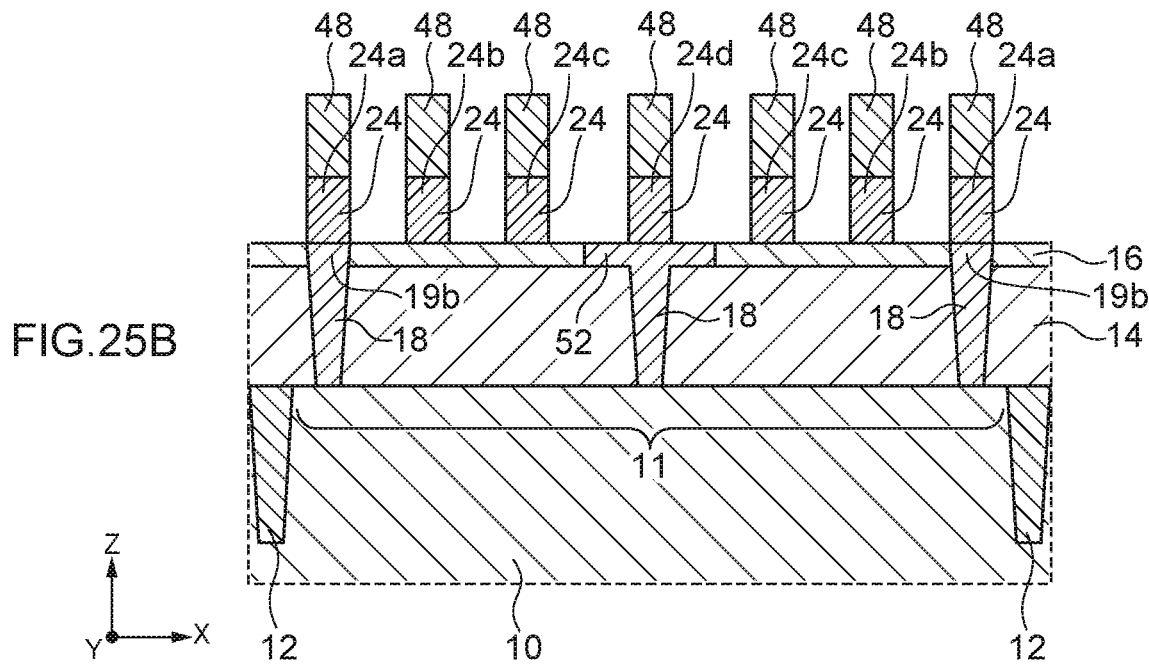

Next, as illustrated in FIGS. 23A and 23B, a first conductive film 17 is formed so as to be embedded in the contact holes 18a and the opening 58, and cover the top face of the second insulating film 16. Next, as illustrated in FIGS. 24A and 24B, the first conductive film 17 is removed until the top face of the second insulating film 16 is exposed, and the contact electrodes 18 and the pad 52 are formed. Next, as illustrated in FIGS. 25A and 25B, the first wiring layer 24 is formed so as to cover the top faces of the contact electrodes 18 and of the second insulating film 16. Next, a patterned etching mask 48 is formed on the first wiring layer 24, and anisotropic dry etching is performed on the first wiring layer 24 by using the etching mask 48 as a mask, thereby forming the first wiring layer 24 patterned in a line and space layout. The patterned first wiring layer 24 includes the first wiring 24a, the second wiring 24b, the third wiring 24c, and the fourth wiring 24d. The etching mask 48 and the patterned first wiring layer 24 include the first wirings 24a, the second wirings 24b, the third wirings 24c, and the fourth wiring 24d. The first wirings 24a, second wirings 24b, and third wirings 24c have a predetermined distance D between each other. A repeating pitch P of the first wiring 24a, second wiring 24b, and third wiring 24c is the sum (W+D) of the width W and the distance D.

Because the pad 52 and the third wirings 24c exist in a positional relationship in which the positions of the top face of the pad 52 and the bottom faces of the third wirings 24c are aligned, if the pad 52 is mispositioned, there is a possibility of a short occurring between the pad 52 and the third wiring 24c. A predetermined distance is provided between the pad 52 and each adjacent third wiring 24c to prevent a short between the two. Consequently, the distance S between the fourth wiring 24d and each adjacent third wiring 24c is larger than the distance D. Also, for this reason, the repeating pitch F of the fourth wiring 24d and the third wirings 24c adjacent thereto is slightly larger than the repeating pitch P described above.

Figure 26A:
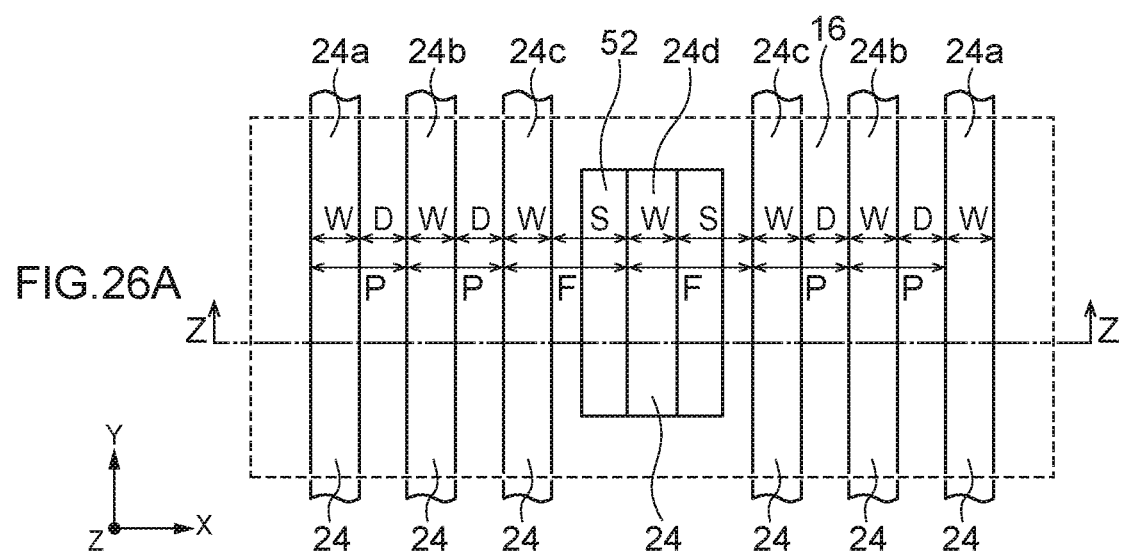
Figure 26B:
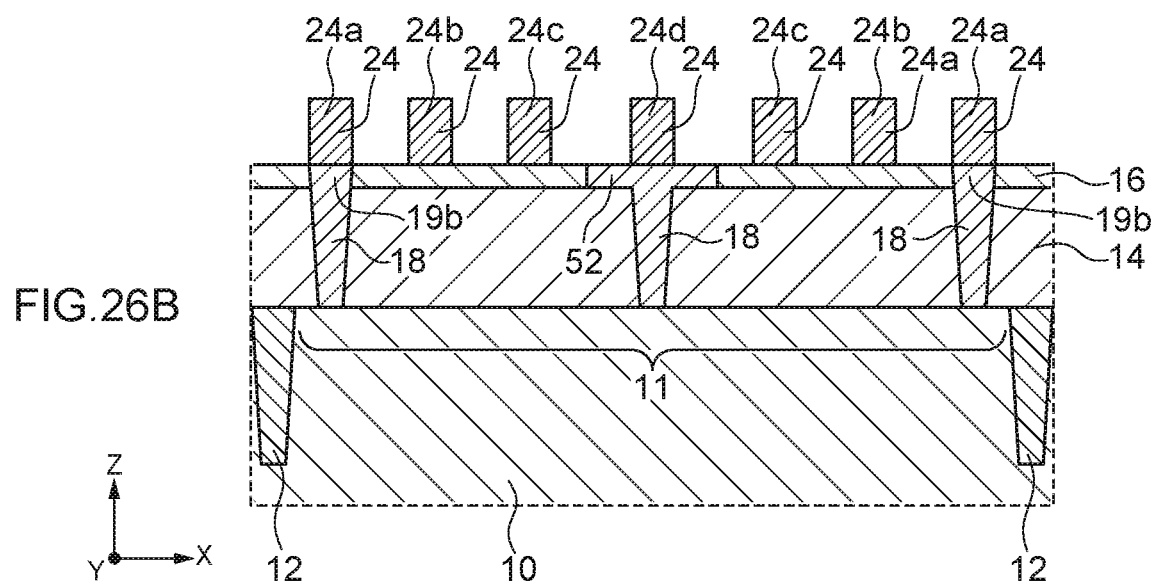
Figure 27A:
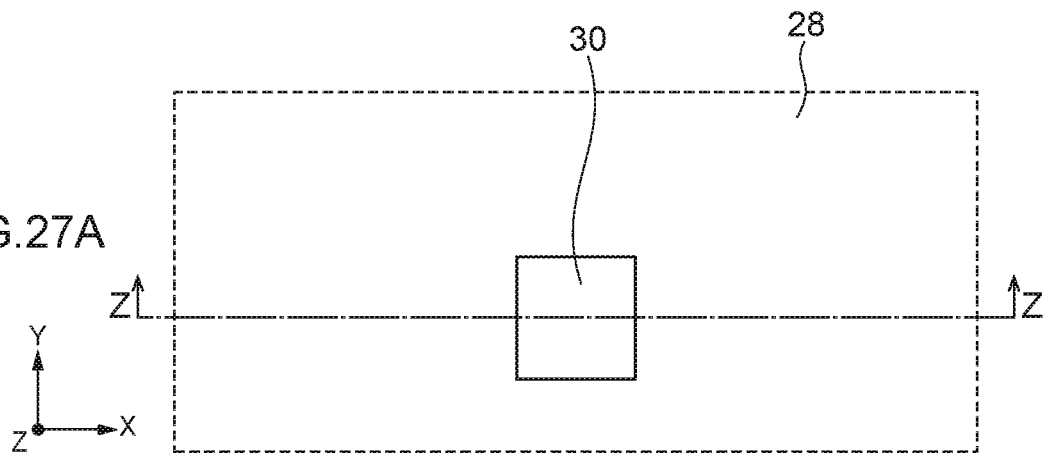
Figure 27B:
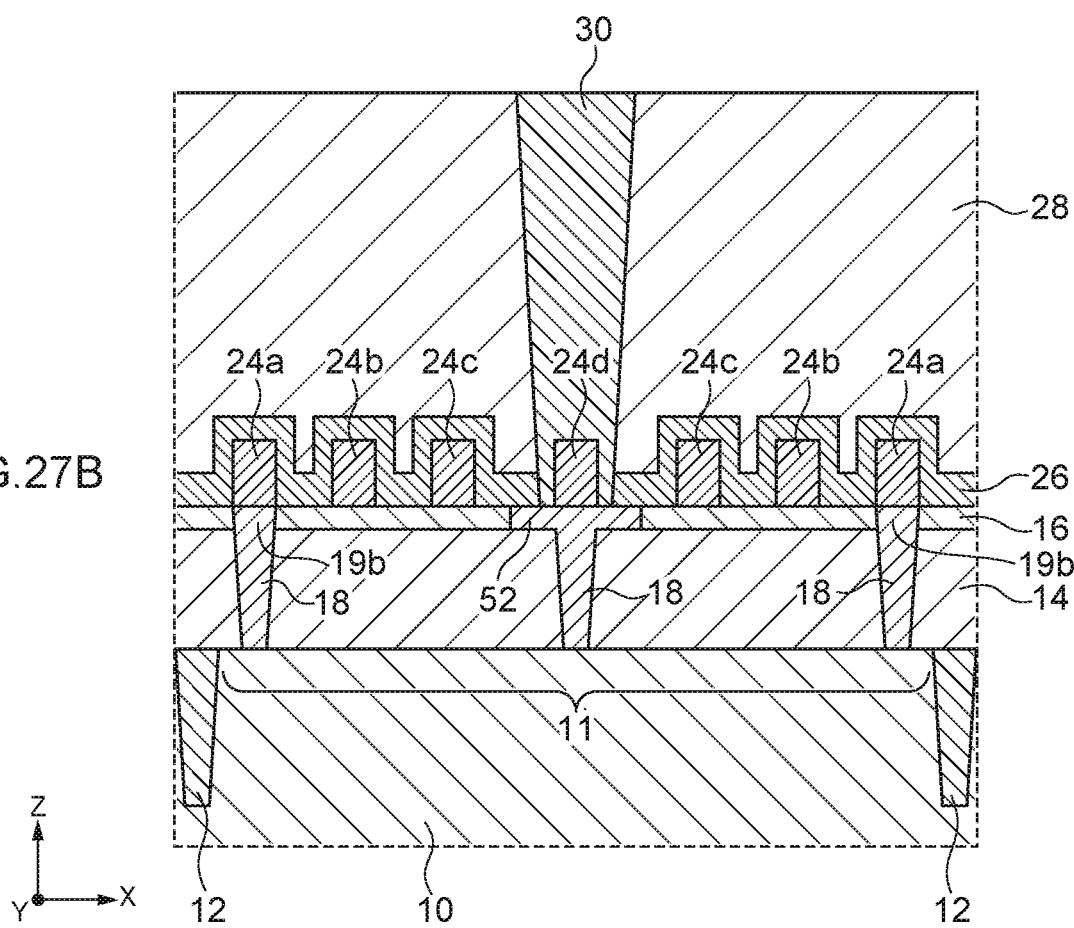

Next, as illustrated in FIGS. 26A and 26B, the etching mask 48 is removed. Next, as illustrated in FIGS. 27A and 27B, the fifth insulating film 26 is formed so as to cover the second insulating film 16 and the first wiring layer 24. Next, the sixth insulating film 28 is formed so as to cover the top face of the fifth insulating film 26. Additionally, a hole that reaches the top face of the pad 52 is formed from the top face of the sixth insulating film 28, and by embedding a conductive material in the hole, the through-hole electrode 30 is formed. The through-hole electrode 30 abuts the top and side faces of the fourth wiring 24d, and the top face of the pad 52. By having the through-hole electrode 30 contact the fourth wiring 24d and the pad 52, the contact surface area is increased, and through-hole resistance can be lowered.

Figure 20B:
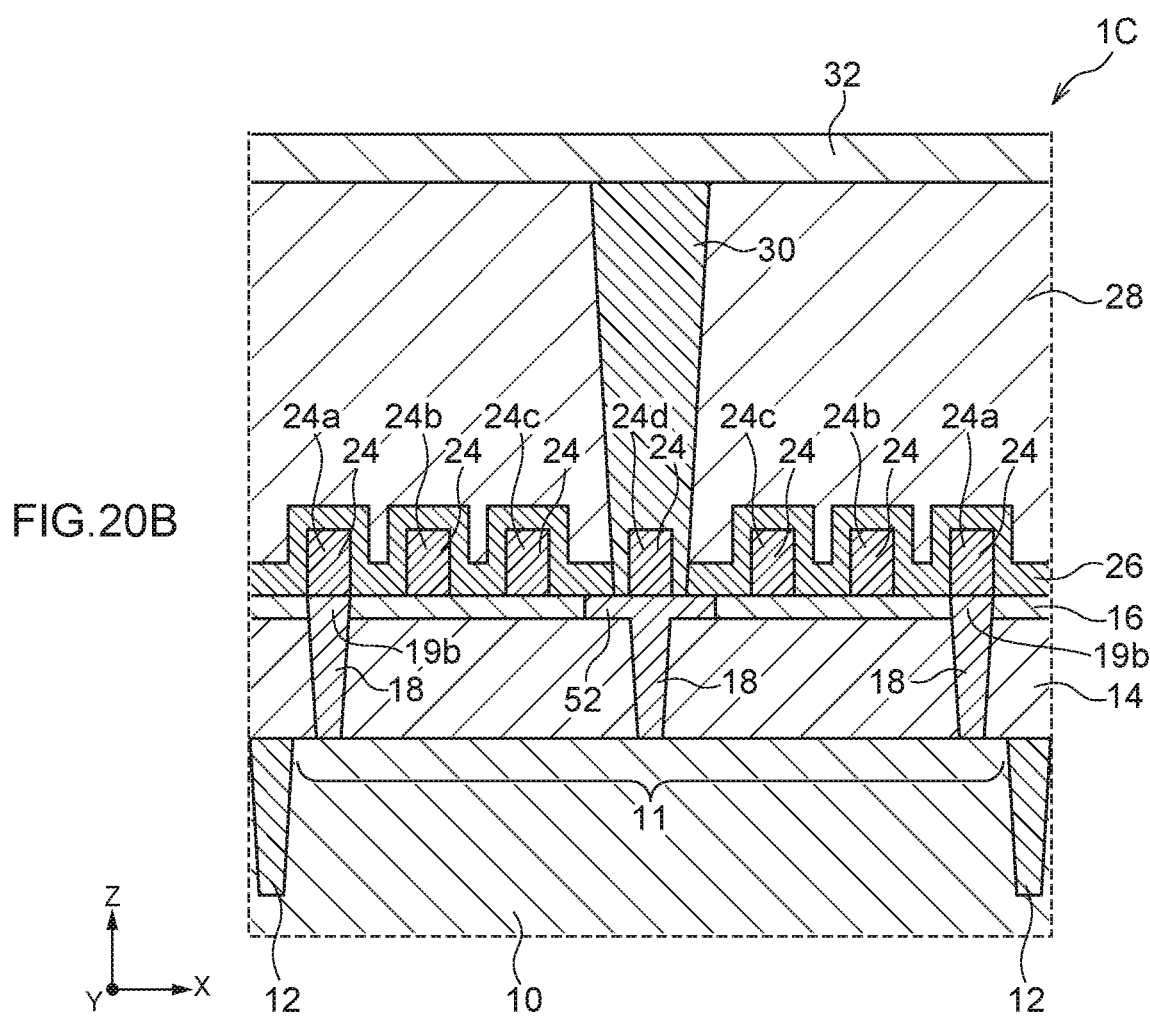
FIG. 20B is a diagram illustrating a semiconductor device according to the third embodiment and a method of forming the same, and illustrates one example of the schematic configuration in a final process stage.
Figure 21A:
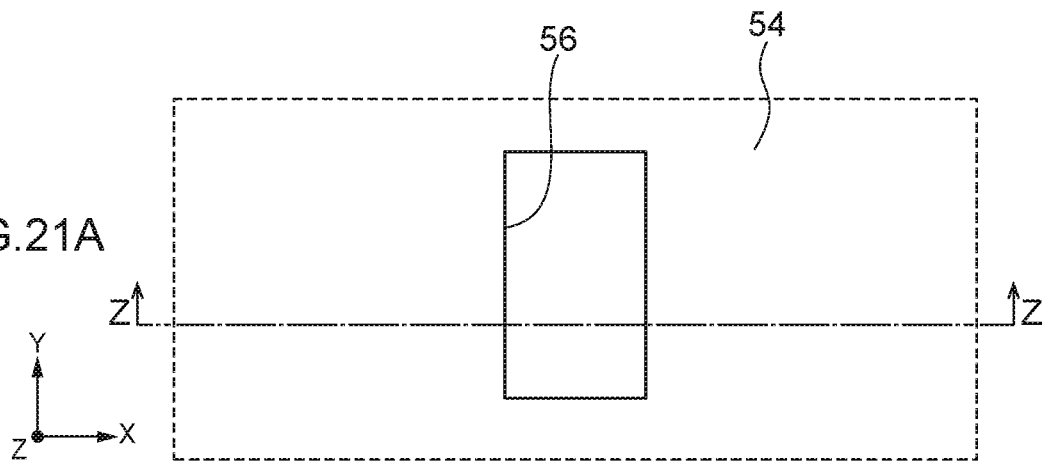
Figure 21B:
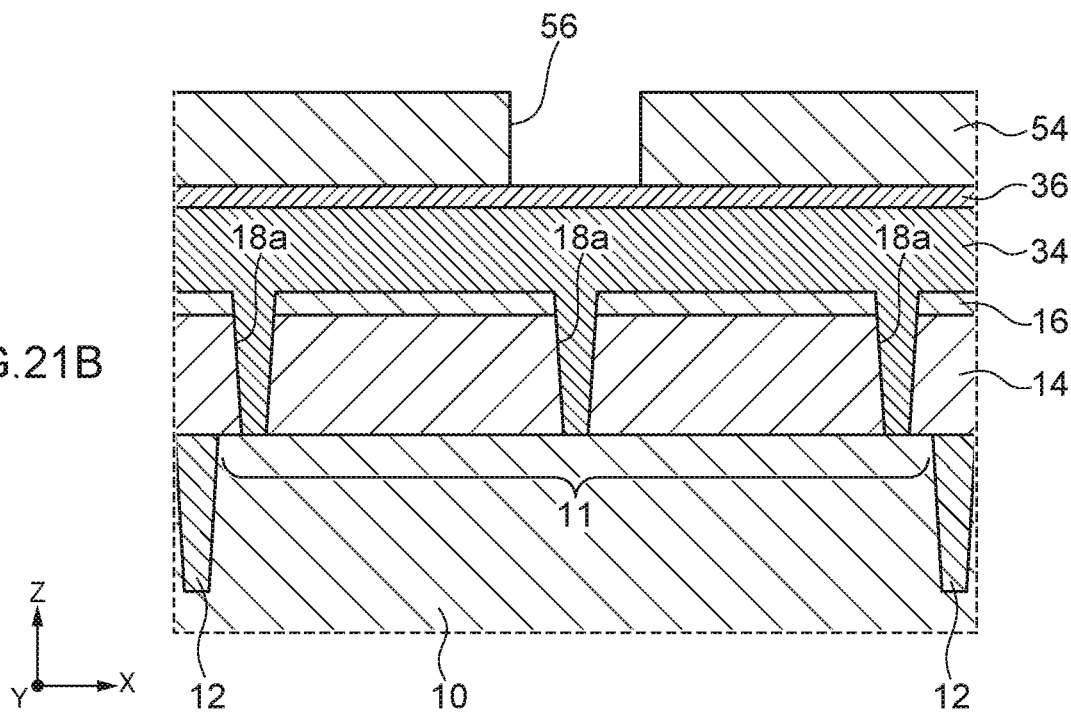

Next, as illustrated in FIGS. 20A and 20B, the wiring 32 that connects to the top face of the through-hole electrode 30 is formed. Through the above steps, the semiconductor device 1C according to the third embodiment is formed. According to the semiconductor device 1C according to the third embodiment and the method of forming the same, effects similar to the semiconductor device 1B according to the second embodiment and the method of forming the same are obtained.

According to the semiconductor device 1C according to the third embodiment and the method of forming the same, the patterning of the pad 52 and the patterning of the first wiring layer 24 are performed by different lithographic processes, as described above. In the patterning of the first wiring layer 24, the patterning of the first wirings 24a, the second wirings 24b, the third wirings 24c, and the fourth wiring 24d can be achieved while also keeping the repeating pitch as small as possible within a range that allows a positioning margin to be secured with respect to the pad 52. Consequently, in the patterning of the first wiring layer 24, the distance between the fourth wiring 24d and the third wirings 24c adjacent thereto is increased slightly, and this portion makes the repeating pitch slightly larger than the first embodiment. However, the distance between the third wiring 24c and the fourth wiring 24d can be set smaller than in the case where the pad 52 and the fourth wiring 24d are a single pattern. With this arrangement, the chip area of the semiconductor device can be reduced, thereby obtaining the semiconductor device 1C with improved yield and lowered costs. Furthermore, because the number of lithography steps is reduced compared to the method according to the first embodiment, costs can be lowered.

As above, DRAM is described as an example of the semiconductor device according to various embodiments, but the above description is merely one example and not intended to be limited to DRAM. Memory devices other than DRAM, such as static random-access memory (SRAM), flash memory, erasable programmable read-only memory (EPROM), magnetoresistive random-access memory (MRAM), and phase-change memory for example can also be applied as the semiconductor device. Furthermore, devices other than memory, including logic ICs such as a microprocessor and an application-specific integrated circuit (ASIC) for example are also applicable as the semiconductor device according to the foregoing embodiments.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

The invention claimed is:

1. A semiconductor device comprising:
   a first layer including a plurality of wirings arranged in a line and space layout;
   a second layer under the first layer, including a first pad electrically connected to at least one of the wirings,
   wherein the second layer includes a second pad electrically connected to at least another one of the wirings, a width of the second ad being less than a width of the first pad; and
   a dielectric film layer between the first layer and the second layer,
   wherein a bottom face of the at least one of the wirings is on the dielectric film layer and above the pad under the dielectric film layer.

2. The semiconductor device of claim 1,
   wherein the wirings have substantially the same width, and are arranged at equal distances.

3. The semiconductor device of claim 1,
   wherein the wirings and the pads are included in different layers.

4. The semiconductor device of claim 1,
   wherein the wirings have substantially the same pitch length.

5. The semiconductor device of claim 4, further comprising a dielectric film layer between the first layer and the second layer,
   wherein at least a portion of the wirings adjacent to the pad and the pad overlap in a vertical direction.

6. The semiconductor device of claim 4,
   wherein at least a portion of the wirings adjacent to the pad and the pad overlap in a vertical direction with the dielectric film layer sandwiched in between.

7. The semiconductor device of claim 1,
   wherein the wirings include tungsten.

8. The semiconductor device of claim 1,
   wherein the pad includes tungsten.

9. An apparatus comprising:
   a first conductive pad in a first layer;

a plurality of wirings in a second layer on the first layer, the plurality of wirings being arranged in parallel each other with substantially the same widths and spaces, and a first wiring of the plurality of wirings being arranged on the first conductive pad;

a contact electrode on the first conductive pad in contact with the first wiring of the plurality of wirings; and a second conductive pad in the first layer, a width of the second conductive pad being less than a width of the first conductive pad;

wherein a third wiring of the plurality of wirings is arranged on the second conductive pad.

10. The apparatus of claim 9, wherein the first conductive pad has a top face with a width greater than a width of each wiring of the plurality of wirings.

11. The apparatus of claim 9, wherein at least a portion of a second wiring of the plurality of wirings is on an insulating film in the first layer, and the portion of the second wiring of the plurality of wirings is insulated from the contact electrode.

* * * * *

UNITED STATES PATENT AND TRADEMARK OFFICE
CERTIFICATE OF CORRECTION

PATENT NO. : 11,581,278 B2
APPLICATION NO. : 17/074267
DATED : February 14, 2023
INVENTOR(S) : Yamaguchi et al.

It is certified that error appears in the above-identified patent and that said Letters Patent is hereby corrected as shown below:

In the Claims

|  | Reads | Should Read |
|---|---|---|
| Column 12, Line 37 | "width of the second ad" | -- width of the second pad -- |

Signed and Sealed this
Eighth Day of August, 2023

Katherine Kelly Vidal
*Director of the United States Patent and Trademark Office*